United States Patent [19]
Miyamoto

[11] Patent Number: 5,932,903
[45] Date of Patent: *Aug. 3, 1999

[54] FERROELECTRIC SEMICONDUCTOR MEMORY CELL, A MEMORY AND A METHOD FOR ACCESSING THE SAME

[75] Inventor: Yasuo Miyamoto, Nara-ken, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/702,279

[22] Filed: Aug. 23, 1996

[30] Foreign Application Priority Data

Aug. 23, 1995 [JP] Japan .................................. 7-215039

[51] Int. Cl.$^6$ .......................... H01L 29/76; H01L 29/94; H01L 31/062; H01L 31/113
[52] U.S. Cl. ............................................. 257/295
[58] Field of Search ............................................. 257/295

[56] References Cited

U.S. PATENT DOCUMENTS 5,119,329   6/1992   Evans, Jr. et al. .
5,515,311   5/1996   Mihara .
5,523,964   6/1996   McMillan et al. .

Primary Examiner—Stephen D. Meier
Attorney, Agent, or Firm—Morrison & Foerster, LLP

[57] ABSTRACT

The ferroelectric semiconductor memory cell comprises: a ferroelectric layer having a first face and a second face; a semiconductor layer disposed on the first face of the ferroelectric layer so as to have different conductivity values depending on a polarization state of the ferroelectric layer, the semiconductor layer having a first end and a second end; and a conductive layer disposed on the second face of the ferroelectric layer, the conductive layer being electrically connected to the first end of the semiconductor layer, wherein a first voltage or a second voltage respectively corresponding to a first value and a second value of the binary information is applied at the second end of the semiconductor layer while applying a third voltage having a potential level between the first and second voltages at the first end of the semiconductor layer, thereby varying the polarization state of the ferroelectric layer so that the binary information is written in the ferroelectric semiconductor memory cell.

6 Claims, 21 Drawing Sheets

PRIOR ART

PRIOR ART

When storing data "L"

When storing data "H"

PRIOR ART

PRIOR ART

Writing data "L"

PRIOR ART

Writing data "H"

PRIOR ART

Reading

PRIOR ART

PRIOR ART

PRIOR ART

PRIOR ART

Writing data "L"

PRIOR ART

Writing data "H"

PRIOR ART

Reading

PRIOR ART

Writing data "L"

Writing data "H"

Non-selected memory cell
(Write operation)

Reading

When storing data "L"

When storing data "H"

FERROELECTRIC SEMICONDUCTOR MEMORY CELL, A MEMORY AND A METHOD FOR ACCESSING THE SAME

BACKGROUND OF THE INVENTION

1. Field of the Invention

The present invention relates to a ferroelectric semiconductor memory cell, a memory, and a method for accessing the same. In particular, the present invention relates to a non-volatile random access memory using the memory cell and a method for accessing the same.

2. Description of the Related Art

As non-volatile random access memories (non-volatile RAMS), such as erasable programmable read-only memories (EPROMs, which are erasable with the use of ultraviolet rays) and electrically erasable and programmable read-only memories (EEPROMs), have been put to practical use. In principle, information can be written in these memories by injecting electrons from a silicon substrate into a floating gate of a memory transistor. However, these non-volatile memories require a very high writing voltage and a very long writing time.

Therefore, so-called FRAMs (ferroelectric memories) have attracted much attention, since they allow information to be written at a relatively low voltage in relatively short time, FIG. 1 shows a typical memory cell 200 constituting a FRAM (hereinafter, such a memory cell will be referred to as a "ferroelectric memory cell"). The ferroelectric memory cell 200 includes a ferroelectric element (capacitance) 201 and a selection transistor 202. One end of the ferroelectric device 201 is coupled to a drive line DL. The selection transistor 202 is connected between another end the ferroelectric element 201 and a bit line BL, with a word line WL being coupled to a gate of the selection transistor 202.

FIGS. 2A and 2B are schematic diagrams illustrating the principle of writing into the ferroelectric memory cell 200. FIGS. 3A and 3B are schematic diagrams illustrating the principle of reading from the ferroelectric memory cell 200.

As in the case of a conventional DRAM, the ferroelectric memory cell 200 includes a transistor and a capacitance. Data is written to the memory cell 200 in such a manner that the values of the data correspond to the respective polarization states or directions of the ferroelectric element 201. Herein, it is assumed that the polarization state (direction) indicated by an upward arrow in FIG. 2A corresponds to data "H", and that the polarization state (direction) indicated by a downward arrow in FIG. 2B corresponds to data "L". When data "H" is written in the memory cell 200, the bit line BL is set at $V_{cc}$ as shown in FIG. 2A, and a pulse voltage signal is supplied to the drive line DL.

FIG. 4 shows a hysteresis curve of the polarization of the ferroelectric element 201 responsive to various voltage levels applied thereto. The abscissa axis represents a voltage E applied to the ferroelectric element 201, and the ordinate axis represents a charge amount Q generated as a result of polarization (indicative of the degree of polarization responsive to the voltage E). Points e, f, g, and h on the hysteresis curve represent various polarization states induced by the voltage E.

As for the directions of polarization and the applied voltage, the direction from the drive line to the bit line is defined as the "positive direction" for conciseness, whereas the other direction is defined as "negative direction". The "positive direction" corresponds to positive polarization charge amounts in the graph of FIG. 4. For example, the upward direction in FIGS. 2A to 3B corresponds to the "positive direction" of polarization.

As shown in the hysteresis curve of FIG. 4, when the bit line BL is set at the $V_{cc}$ level and the drive line DL at 0V, a voltage $V_{cc}$ is applied across the ferroelectric element 201 so that the ferroelectric element 201 takes a polarization state corresponding to point e, irrespective of the initial state of polarization thereof. When the drive line DL is set to the $V_{cc}$ level at point e, the polarization state of the ferroelectric element 201 shifts to point f. When the drive line DL is set to 0 V again, the polarization state of the ferroelectric element 201 shifts back to point e (f→e). If the application of voltage is stopped, the charges resulting from polarization gradually diminish over time, until reaching a state where only charges due to remanence (residual polarization) exist (e→f).

When data "L" is written in the memory cell 200, the bit line BL is set at 0 V, and a pulse voltage signal is supplied to the drive line DL. As a result, the ferroelectric element 201 is polarized in the negative direction. Referring to the hysteresis curve in FIG. 4, when the bit line BL is set at 0 V and the drive line DL is set at the $V_{cc}$ level, a voltage $-V_{cc}$ is applied across the ferroelectric element 201 so that the ferroelectric element 201 takes a polarization state corresponding to point g, irrespective of the initial state of polarization. When the drive line DL is set to 0 V at point g, the polarization state of the ferroelectric element 201 shifts to point h. The polarization state at point h is maintained even after the supply of power is terminated.

Data stored in the memory cell 200 can be read by precharging the bit line BL at 0 V and supplying a pulse voltage signal to the drive line DL. Referring to the hysteresis curve in FIG. 4, the following occurs as a result of the application of the pulse voltage signal: If the memory cell 200 has data "H" stored therein, the polarization state of the ferroelectric element 201 shifts from the initial point f to an intermediate state g, and to point h. Similarly, if the memory cell 200 has data "L" stored therein, the polarization of the ferroelectric element 201 shifts from the initial point h to an intermediate state g, and back to point h.

As described above, when reading data from the memory cell 200 storing data "H", the ferroelectric element 201 takes opposite polarization states before and after the reading. On the other hand, when reading data from the memory cell 200 storing data "L", the polarization state of the ferroelectric element 201 remains unchanged. In other words, different charge amounts are read out from the memory cell 200 depending on the data (i.e., whether it is "H" or "L"). Specifically, when reading data "H" out of the memory cell 200, the memory cell 200 generates a charge amount difference $Q_{sw}$ on the bit line BL corresponding to the difference between the polarization states h and f. However, when reading data "L" out of the memory cell 200, the memory cell 200 does not create any difference in the charge amount on the bit line BL. Thus, by detecting the presence/absence of difference in the charge amount, it can be determined whether the memory cell 200 stores data "H" or data "L".

In a FRAM of the above configuration, the polarization state of the ferroelectric element 201 reverses after each read of data "H", so that the data "H" is lost after the reading (thereby resulting in a so-called "destructive reading"). In order to maintain the data after a reading, it is necessary to rewrite the data into the FRAM following each reading. In such a destructive reading, the ferroelectric element 201 constantly undergoes reversal of polarization states, thereby causing fatigue in the thin ferroelectric film, which ultimately reduces the lifetime of the FRAM.

In order to solve the above-mentioned problem, a FRAM capable of non-destructive reading (where the polarization state of the ferroelectric element does not reverse) has been developed. For example, Japanese National Patent Publication No. 5-505699 discloses a memory cell incorporating a ferroelectric transistor instead of the above-described ferroelectric capacitance.

FIG. 5A is a schematic diagram showing the configuration of the above-mentioned ferroelectric memory cell of Japanese National Patent Publication No. 5-505699. FIG. 5B is a cross-sectional view showing the actual structure of the memory cell. As shown in FIG. 5A, the ferroelectric memory cell 210 includes a ferroelectric transistor 211 for storing information provided via a bit line BL and a MOS transistor (transfer gate) 212 for connecting/disconnecting between the bit line BL and the transistor 211.

The ferroelectric transistor 211 includes a ferroelectric layer 211a, a semiconductor layer 211b disposed on one face of the ferroelectric layer 211a so as to have different conductivity values depending on the polarization state of the ferroelectric layer 211a, and a conductive layer 211c disposed on the other face of the ferroelectric layer 211a. Binary information can be stored in the ferroelectric memory cell 210 by utilizing different polarization states of the ferroelectric layer 211a. An end A of the semiconductor layer 211b is coupled to the bit line BL via the MOS transistor 212, and the other end B of the semiconductor layer 211b is grounded.

The structure of the above-mentioned ferroelectric memory cell 210 will be described with reference to FIG. 5B.

As shown in FIG. 5B, the MOS transistor 212 includes source and drain diffusion regions 212a and 212b formed on a surface of a semiconductor substrate 1. A gate electrode 212c is provided above the substrate 1 between the diffusion regions 212a and 212b. The ferroelectric transistor 211 adjoins the MOS transistor 212 on the semiconductor substrate 1. The ferroelectric layer 211a and the semiconductor layer 211b are laminated on the conductive layer 211c, which functions as a lower electrode. Upper electrodes $211d_1$ and $211d_2$ are provided at opposing ends of the semiconductor layer 211b. The upper electrode $211d_1$ at one end of the semiconductor layer 211b is connected to the diffusion layer 212b of the MOS transistor 212 via a metal wire 213. The other diffusion layer 212a of the MOS transistor 212 is connected to a metal wire 214 functioning as the bit line BL.

The lower electrode or conductive layer 211c of the ferroelectric transistor 211 can be composed of a metal. However, the layer 211b (disposed on the other side of the ferroelectric layer 211a with respect to the conductive layer 211c) must be a semiconductor layer, rather than a mere resistive layer, because the ferroelectric memory cell 210 utilizes the polarization states of the ferroelectric layer 211a as determined by the state of the interface between the ferroelectric layer 211a and the semiconductor layer 211b.

Data can be written in the ferroelectric memory cell 210 of the above-mentioned configuration in the same manner as in the memory cell 200 shown in FIG. 1. Specifically, data can be written by setting the bit line BL at the $V_{cc}$ level or 0 V and supplying a pulse voltage signal to a drive line DL so as to polarize the ferroelectric layer 211a.

FIGS. 6A and 6B show the directions of polarization of the ferroelectric layer 211a resulting from the above-mentioned writing of data. FIG. 7 is a hysteresis curve showing the conductivity ratio of the semiconductor layer 211b relative to various voltage levels applied to the ferroelectric layer 211a.

FIGS. 8A and 9A show the potential levels of the bit line BL, a word line WL, and the drive line DL when data "L" and data "H" are written in the ferroelectric memory cell 210, respectively. FIGS. 8B and 9B show the voltage levels applied to the ferroelectric layer 211a when data "L" and data "H" are written in the ferroelectric memory cell 210, respectively. In FIGS. 8B and 9B, the ordinate axis represents the voltage applied to the ferroelectric layer 211a, and the abscissa axis represents the distance from the end A to various points within the ferroelectric layer 211a.

When data "L" is written in the ferroelectric memory cell 210, the bit line BL is set at the $V_{cc}$ level, and a pulse voltage signal is supplied to the drive line DL, as shown in FIG. 8A. When data "H" is written in the ferroelectric memory cell 210, the bit line BL is set at 0 V, and a pulse voltage signal is supplied to the drive line DL, as shown in FIG. 9A.

Thus, when writing data "H" in the ferroelectric memory cell 210, a voltage is uniformly applied across the entire surface of the ferroelectric layer 211a, as shown in FIG. 9B. Therefore, a uniform polarization state is observed across the entire ferroelectric layer 211a, as shown in FIG. 6B.

When data "L" is written in the ferroelectric memory cell 210, the voltage applied to the ferroelectric layer 211a decreases away from the end A or toward the end B, as shown in FIG. 8B. Due to the resistance of 10 kΩ to 1 MΩ of the semiconductor layer 211b in contact with the ferroelectric layer 211a, the ends A and B of the ferroelectric layer 211a have a significant difference in potential. As a result, the ferroelectric layer 211a is greatly polarized near the end A, but is substantially unpolarized near the end B (FIG. 6A). The data "H" and "L" can be stored by utilizing the different polarization states at the end A of the ferroelectric layer 211a.

Now, the process of writing data in the ferroelectric memory cell 210 will be described with reference to the hysteresis curve shown in FIG. 7. FIG. 7 shows the relationship between a voltage E applied to the ferroelectric layer 211a (on the abscissa axis) and the conductivity ratio I (on the ordinate axis) of the semiconductor layer 211b.

When no voltage is applied to the ferroelectric layer 211a, the semiconductor layer 211b has a conductivity ratio shown at point b or point d. Data "L" is written by setting the bit line BL at the $V_{cc}$ level and the drive line DL at 0 V, so that a voltage $-(V_{cc}-V_{th})$ (where $V_{th}$ represents a threshold voltage of the MOS transistor 212 functioning as a transfer gate) is applied to the ferroelectric layer 211a. As a result, the conductivity ratio of the semiconductor layer 211b shifts to point c. When both the drive line DL and the bit line BL return to their predetermined write-complete levels, the conductivity ratio of the semiconductor layer 211b increases to point d, indicative of a reduced resistivity of the semiconductor layer 211b.

Data "H" is written by setting the bit line BL at 0 V and the drive line DL at the $V_{cc}$ level (so that a voltage $V_{cc}$ is applied to the ferroelectric layer 211a). As a result, the conductivity ratio of the semiconductor layer 211b shifts to point a. When both the drive line DL and the bit line BL return to their predetermined write-complete levels, the conductivity ratio of the semiconductor layer 211b decreases to point b, indicative of an increased resistivity of the semiconductor layer 211b.

The respective states of the ferroelectric memory cell 210 corresponding to data "H" and data "L" are retained even after the supply of power is terminated. Specifically, when data "H" is stored in the ferroelectric memory cell 210, a depletion layer pervades the semiconductor layer 211b, thereby increasing the resistivity of the semiconductor layer 211b. When data "L" is stored in the ferroelectric memory cell 210, an accumulation layer pervades the semiconductor layer 211b, thereby decreasing the resistivity of the semiconductor layer 211b.

Data stored in the ferroelectric memory cell 210 can be read by precharging the bit line BL at a voltage which does not substantially affect the polarization of the ferroelectric layer 211a (e.g., 0.4 V) and applying a voltage $V_{cc}$ to the word line WL to turn on the transfer gate 212, thereby extracting the charge on the bit line BL to the ground level. Since the ferroelectric transistor 211 has different resistivities depending on the data (i.e., "H" or "L") stored in the ferroelectric memory cell 210, the potential of the bit line BL also differs depending on whether data "H" or data "L" is stored in the ferroelectric memory cell 210.

Specifically, the process of reading data is performed by comparing the potential (hereinafter referred to as a "read-out potential") read from the ferroelectric memory cell 210 against a predetermined reference potential. The reference potential can be, for example, a potential read out from a reference cell having a resistivity between the resistivity corresponding to data "H" and the resistivity corresponding to data "L". Alternatively, it is also possible to generate an intermediate potential by short-circuiting two reference bit lines (i.e., a bit line from which "H" data is being read out and another bit line from which "L" data is being read out) and employ the intermediate potential as a reference potential. FIG. 11 shows read-out potential levels and a reference level in such a reference system. Thus, in the case of a ferroelectric memory cell incorporating a ferroelectric transistor, the polarization of the memory cell is not destroyed when reading data, whereby the fatigue of the thin ferroelectric film can be reduced.

FIG. 12 shows a memory cell array 300 as one application of the above-mentioned ferroelectric memory cell configured as a semiconductor memory device. The memory cell array 300 consists essentially of a plurality of the above-described memory cells 210 arranged in a matrix shape. When data is written in a memory cell $M_{11}$ shown in FIG. 12, for example, a bit line $BL_1$ is set at either an "H" level or an "L" level; the transfer gate of the memory cell $M_{11}$ is turned on by applying a voltage to a word line $WL_1$; and a pulse voltage signal is applied to a drive line $DL_1$.

As described above, data is written in a given memory cell in the memory cell array 300 when a pulse voltage signal is applied to the corresponding drive line. Herein, the pulse voltage signal to be applied to the drive line is a voltage signal capable of reversing the polarization state of the ferroelectric layer of the memory cell, e.g., a pulse whose level is usually at the GND level but shifts to the $V_{cc}$ level during a predetermined period, or a pulse whose level is usually at the $V_{cc}$ level but shifts to the GND level during a predetermined period.

When the bit line BL is precharged at a voltage which does not substantially affect the polarization of the ferroelectric layer (e.g., 0.4 V) for reading data stored in the ferroelectric memory cell, this voltage is substantially directly applied to the end A of the ferroelectric layer 211a, as shown in FIG. 10. This voltage is smaller than the threshold voltage $V_{th}$ of the transfer gate 212. On the other hand, when data is written in the ferroelectric memory cell, a voltage which is higher than the threshold voltage $V_{th}$ of the transfer gate 212 is applied, so that the end A of the ferroelectric layer 211a has a potential $V_{cc}-V_{th}$ with respect to the potential of the other end B as shown in FIG. 8A.

Various studies have been conducted to discover the voltage level which enables reading without substantially affecting the polarization of the ferroelectric layer (i.e., a non-destructive read). Simulation results and the like indicate that a voltage of about 0.4 V is appropriate for this purpose.

Furthermore, various methods may be adopted as the reference system for reading. Any system may be used in which data "H" and data "L" can be determined by comparing the bit line potential against a potential generated by a reference level generation circuit capable of providing the potential characteristic curve shown in FIG. 11. Instead of short-circuiting two reference bit lines (i.e., a bit line from which "H" data is being read out and another bit line from which "L" data is being read out) as described above, a reference level can be provided by a circuit for generating a level which is somewhat higher than the "L" level and somewhat lower than the "H" level.

However, a semiconductor memory device incorporating the memory cell array 300 shown in FIG. 12 has the following problems because the end B of the semiconductor layer of the ferroelectric transistor is grounded.

When writing data in the memory cell $M_{11}$ of the memory cell array 300, the transfer gate (not shown) of the memory cell $M_{11}$ is turned on by the application of a voltage to the word line $WL_1$, and a pulse voltage signal is supplied to the drive line $DL_1$. However, the voltage applied to the word line $WL_1$ also connects the bit lines $BL_2$ to $BL_n$ to the respective memory cells $M_{12}$ to $M_{1n}$ during the application of the pulse voltage signal to the drive line $DL_1$. Since the bit lines $BL_2$ to $BL_n$ are at either the $V_{cc}$ level, the GND level, or an intermediate level therebetween, an unknown voltage may be applied to the ferroelectric layers in the memory cells $M_{12}$ to $M1_n$, thereby destroying the data stored in the memory cells $M_{12}$ to $M1_n$.

In general, 4 to 16 bits of data are written in a semiconductor memory by one access. In order to ensure that unaccessed memory cells (i.e., memory cells other than the memory cell which is being accessed) retain the data existing before the write access, it is necessary to divide the memory cell array into sub-arrays, and provide a word line and a drive line for each sub-array so that no voltage is applied to the ferroelectric layer of the ferroelectric transistors of the unaccessed memory cells.

FIG. 13 shows an exemplary configuration of a memory cell array 310 including sub-arrays such that 2 bits of data can be written in each sub-array. In FIG. 13, the memory cell array 310 includes memory cells arranged in a 4 (rows)×2 (columns) matrix, divided into a first sub-array 310a of 2×2 memory cells and a second sub-array 310b of 2×2 memory cells. As shown in FIG. 13, the memory cell array 310 includes memory cells $M_{11}$ to $M_{14}$ in the 1st column (from the 1st to 4th rows) and memory cells $M_{21}$ to $M_{24}$ in the 2nd column (from the 1st to 4th rows).

The first sub-array 310a includes memory cells $M_{11}$, $M_{12}$, $M_{21}$, and $M_{22}$. A first sub-decoder 321a is provided for the memory cells $M_{11}$ and $M_{12}$, and a second sub-decoder 322a is provided for the memory cells $M_{21}$ and $M_{22}$. The second sub-array 310b includes memory cells $M_{13}$, $M_{14}$, $M_{23}$, and $M_{24}$. A third sub-decoder 321b is provided for the memory cells $M_{13}$ and $M_{14}$, and a fourth sub-decoder 322b is provided for the memory cells $M_{23}$ and $M_{24}$.

In the memory cell array 310 having the above configuration, word lines $WL_{11}$ and $WL_{21}$ and drive lines $DL_{11}$ and $DL_{21}$ are provided for the first sub-array 310a, whereas word lines $WL_{12}$ and $WL_{22}$ and drive lines $DL_{12}$ and $DL_{22}$ are provided for the second sub-array 310b. Therefore, it is possible to electrically connect only the target memory cell (i.e., the memory cell in which data is to be written) to its corresponding bit line, so that writing can be performed for a pair of memory cells constituting either sub-array 310a or 310b. For example, when writing data "H" in the memory cell $M_{11}$ and data "L" in the memory cell $M_{12}$, the bit line $BL_1$ and the bit line $BL_2$ are at 0 V and the VCC, respectively; a voltage is applied to the word line $WL_{11}$ so as to turn on the transfer gates (not shown); and a pulse voltage signal is supplied to the drive line $DL_{11}$. Thus, data "H" and data "L" can be written in the memory cells $M_{11}$ and $M_{12}$, respectively.

During the above writing operation, the transfer gates (not shown) of the memory cells $M_{13}$, $M_{14}$, $M_{21}$, $M_{22}$, $M_{23}$, and $M_{24}$ are turned off, and no pulse voltage signal is supplied to the drive lines $DL_{12}$, $DL_{21}$, and $DL_{22}$. Therefore, no voltage is applied to the ferroelectric layers in the memory cells $M_{13}$, $M_{14}$, $M_{21}$, $M_{22}$, $M_{23}$, and $M_{24}$, so that the data stored therein is prevented from being rewritten.

However, the memory cell array 310 has the problem of an increased chip size because of the sub-decoders provided for each sub-array 310a or 310b. Moreover, a row decoder signal for driving the sub-decoders of each sub-array 310a or 310b is required, thereby further complicating the signal control circuit for realizing control in the row direction.

There has also been proposed a ferroelectric memory cell having the configuration shown in FIG. 14, in addition the ferroelectric memory cell shown in FIGS. 5A and 5B.

The ferroelectric memory cell 210' is obtained by short-circuiting the end B of the semiconductor layer 211b in the ferroelectric memory cell 210 (shown in FIG. 5A) to the conductive layer 211c via a predetermined line. Data can be written in the ferroelectric memory cell 210' in the same manner as in the ferroelectric memory cell 210.

FIGS. 15A and 16A show respective potential levels of a bit line BL, a word line WL, and a drive line DL when data "L" and data "H" are written in the ferroelectric memory cell 210', respectively. FIGS. 15B and 16B show voltage levels applied to a ferroelectric layer 211a when data "L" and data "H" are written in the ferroelectric memory cell 210', respectively. In FIGS. 15B and 16B, the ordinate axis represents the voltage applied to the ferroelectric layer 211a, and the abscissa axis represents the distance from the end A to various points within the ferroelectric layer 211a.

When data "L" is written in the ferroelectric memory cell 210', the bit line BL is set at the $V_{cc}$ level, and a pulse voltage signal is supplied to the drive line DL, as shown in FIG. 15A. When data "H" is written in the ferroelectric memory cell 210', the bit line BL is set at 0 V, and a pulse voltage signal is supplied to the drive line DL, as shown in FIG. 16A.

FIG. 18 shows a memory cell array 300' as one application of a ferroelectric memory cell of this type, configured as a semiconductor memory device. The memory cell array 300' consists essentially of the above-described memory cells 210' arranged in a matrix shape.

When writing data in the memory cell $M_{11}$ of the memory cell array 300', the transfer gate (not shown) of the memory cell $M_{11}$ is turned on by the application of a voltage to the word line $WLh_1$, which also connects the bit lines $BL_2$ to $BL_n$ to the respective memory cells $M_{12}$ to $M_{1n}$ during the application of a pulse voltage signal to the drive line $DL_1$. As a result, the data stored in the memory cells $M_{12}$ to $M_{1n}$ may be destroyed. Therefore, the memory cell array 300' consisting of the ferroelectric memory cells 210' is also required to be divided into sub-arrays as previously shown in FIG. 13.

As described above in the case of a memory device composed of an array of memory cells having the ferroelectric transistor shown in either FIG. 5A or FIG. 14, it is necessary to divide the memory cell array into a plurality of blocks (sub-arrays), e.g., as shown in FIG. 13, and provide a sub-decoder for each block, according to the conventional reading/writing method which sets the bit line and the drive line at 0 V or the $V_{cc}$ level.

However, the use of sub-decoders is disadvantageous because they occupy large areas on the substrate, thereby increasing the size of the entire memory chip. A typical sub-decoder occupies an area approximately the the size of one memory cell.

Especially in the case where a plurality of sub-decoders are provided for each sub-array, as in the memory cell array 300 shown in FIG. 13, it is necessary to control a number of driving signals for the decoders and the bit lines, thereby making the entire memory device difficult to use.

SUMMARY OF THE INVENTION

The ferroelectric semiconductor memory cell of this invention comprising: a ferroelectric layer having a first face and a second face; a semiconductor layer disposed on the first face of the ferroelectric layer so as to have different conductivity values depending on a polarization state of the ferroelectric layer, the semiconductor layer having a first end and a second end; and a conductive layer disposed on the second face of the ferroelectric layer, the conductive layer being electrically connected to the first end of the semiconductor layer, wherein a first voltage or a second voltage respectively corresponding to a first value and a second value of the binary information is applied at the second end of the semiconductor layer while applying a third voltage having a potential level between the first and second voltages at the first end of the semiconductor layer, thereby varying the polarization state of the ferroelectric layer so that the binary information is written in the ferroelectric semiconductor memory cell.

In one embodiment of the present invention, the first voltage is a $V_{cc}$ level, the second voltage is a GND level, and the third voltage is a level equal to $V_{cc}/2$.

The memory according to this invention comprising: a memory cell array including a plurality of the ferroelectric semiconductor memory cells, the ferroelectric semiconductor memory cells forming a matrix of rows and columns, and each ferroelectric semiconductor memory cell including: a ferroelectric layer having a first face and a second face; a semiconductor layer disposed on the first face of the ferroelectric layer so as to have different conductivity values depending on a polarization state of the ferroelectric layer, the semiconductor layer having a first end and a second end; and a conductive layer disposed on the second face of the ferroelectric layer, the conductive layer being electrically connected to the first end of the semiconductor layer, wherein a first voltage or a second voltage respectively corresponding to a first value and a second value of the binary information is applied at the second end of the semiconductor layer while applying a third voltage having a potential level between the first and second voltages at the first end of the semiconductor layer, thereby varying the polarization state of the ferroelectric layer so that the binary information is written in the ferroelectric semiconductor memory cell; a bit line is provided for each row of the ferroelectric semiconductor memory cells in the memory cell array, the bit line applying a predetermined potential level at the second end of the semiconductor layer of each ferroelectric semiconductor memory cell in the row; and a power supply for applying the third voltage to the bit line.

The method of this invention is a method for accessing a memory comprising a memory cell array including a plurality of the ferroelectric semiconductor memory cells, each ferroelectric semiconductor memory cell including: a ferroelectric layer having a first face and a second face; a semiconductor layer disposed on the first face of the ferroelectric layer so as to have different conductivity values depending on a polarization state of the ferroelectric layer, the semiconductor layer having a first end and a second end; and a conductive layer disposed on the second face of the ferroelectric layer, the conductive layer being electrically connected to the first end of the semiconductor layer, in write operations in which binary information having a first value and a second value is written to the ferroelectric semiconductor memory cells by selectively applying one of a first voltage and a second voltage respectively corresponding to the first value and the second value. The method comprises the steps of: applying the first voltage at the second end of the semiconductor layer of the ferroelectric semiconductor memory cell while applying a third voltage at the first end of the semiconductor layer of the ferroelectric semiconductor memory cell, the third voltage having a potential level between the first and second voltages, in order to write the first value, and applying the second voltage at the second end of the semiconductor layer of the ferroelectric semiconductor memory cell while applying the third voltage at the first end of the semiconductor layer, in order to write the second value.

The method of the present invention is a method for accessing a memory comprising a memory cell array including a plurality of the ferroelectric semiconductor memory cells, each ferroelectric semiconductor memory cell including: a ferroelectric layer having a first face and a second face; a semiconductor layer disposed on the first face of the ferroelectric layer so as to have different conductivity values depending on a polarization state of the ferroelectric layer, the semiconductor layer having a first end and a second end; and a conductive layer disposed on the second face of the ferroelectric layer, the conductive layer being electrically connected to the first end of the semiconductor layer, in read operations in which binary information having a first value and a second value is read from the ferroelectric semiconductor memory cells. The method comprises the steps of: applying one of the first and second voltage at the first end of the semiconductor layer of the ferroelectric semiconductor memory cell while applying a fourth voltage at the second end of the semiconductor layer of the ferroelectric semiconductor memory cell, the fourth voltage having a potential level which does not affect the polarization state of the ferroelectric layer of the selected ferroelectric semiconductor memory cell due to a difference in level between the fourth voltage and the first voltage or the second voltage.

In one embodiment of the invention, the binary information stored in the ferroelectric semiconductor memory cell is read out by comparing a potential level of a voltage signal which is read out from the selected ferroelectric semiconductor memory cell against a predetermined reference potential having a level between predetermined read-out potentials corresponding to the first and second values of the binary information.

In another embodiment of the present invention, the predetermined reference potential is a potential level of a voltage signal which is read out from a reference ferroelectric semiconductor memory cell including a ferroelectric layer having a polarization state between a polarization state of a predetermined ferroelectric semiconductor memory cell storing the first value of the binary information and a polarization state of a predetermined ferroelectric semiconductor memory cell storing the second value of the binary information.

In another embodiment of the present invention, the predetermined reference potential is generated by short-circuiting a first reference bit line having a read-out potential corresponding to the first value of the binary information and a second reference bit line having a read-out potential corresponding to the second value of the binary information.

Thus, the invention described herein makes possible the advantages of (1) providing a ferroelectric semiconductor memory cell which allows data stored therein to be read in a non-destructive manner, and allows data to be written in a target memory cell (when configured as part of a memory cell array) without destroying data retained in non-target memory cells (i.e., memory cells other than the target memory cell) without dividing the memory cell array into a plurality of blocks; (2) providing a memory incorporating the memory cells; and (3) providing a method for accessing the same.

These and other advantages of the present invention will become apparent to those skilled in the art upon reading and understanding the following detailed description with reference to the accompanying figures.

DESCRIPTION OF THE PREFERRED EMBODIMENTS

EXAMPLE 1

Figure 19A:
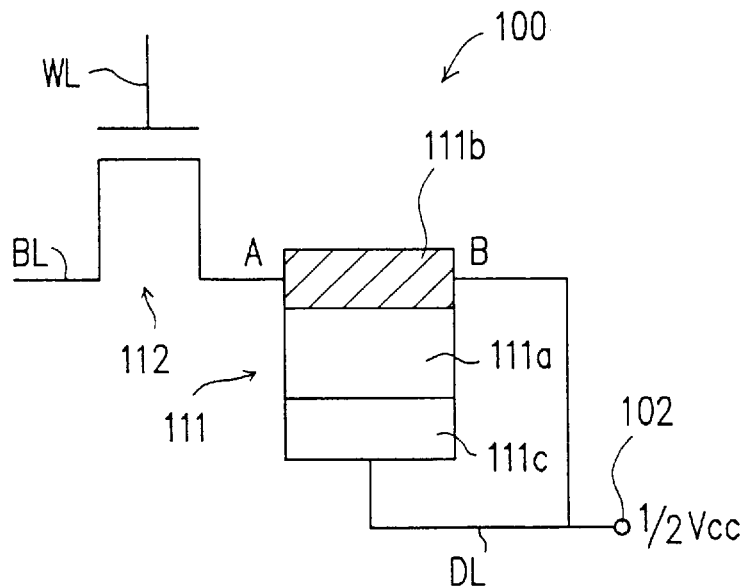
FIG. 19A is a diagram schematically showing the configuration of a ferroelectric memory cell according to Example 1 of the present invention.
Figure 19B:
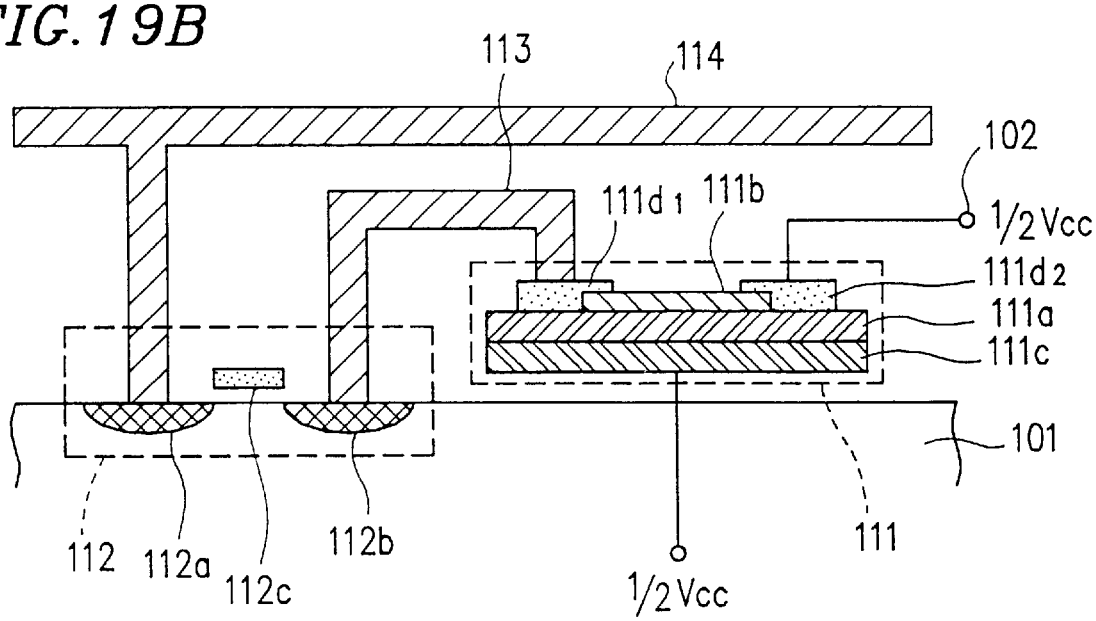
FIG. 19B is a cross-sectional view showing the ferroelectric memory cell shown in FIG. 19A.

FIGS. 19A and 19B show a ferroelectric semiconductor memory cell 100 according to Example 1 of the present invention. FIG. 19A is a schematic diagram showing the configuration of the ferroelectric memory cell 100. FIG. 19B is a cross-sectional view showing the structure of the memory cell 100.

As shown in FIG. 19A, the ferroelectric memory cell 100 includes a ferroelectric transistor 111 and a MOS transistor 112. The ferroelectric transistor 111 functions to store information provided via a bit line BL. The MOS transistor (functioning as a transfer gate) 112 connects or disconnects between the bit line BL and the transistor 111.

The ferroelectric transistor 111 includes a ferroelectric layer 111a, a semiconductor layer 111b disposed on one face of the ferroelectric layer 111a so as to have different conductivity values depending on the polarization state of the ferroelectric layer 111a, and a conductive layer 111c disposed on the other face of the ferroelectric layer 111a. Binary information can be stored in the ferroelectric memory cell 100 by utilizing different polarization states of the ferroelectric layer 111a.

An end A of the semiconductor layer 111b is coupled to the bit line BL via the transfer gate (MOS transistor) 112. The other end B of the semiconductor layer 111b is coupled to a terminal 102, to which a potential of $\frac{1}{2}V_{cc}$ is supplied. The conductive layer 111c is also coupled to the terminal 102 via a drive line DL.

In the present example, when data is written in the ferroelectric memory cell 100, a potential of $\frac{1}{2}V_{cc}$ is supplied to the conductive layer 111c and the end B of the semiconductor layer 111b.

As shown in FIG. 19B, the transfer gate 112 is composed of a select MOS transistor. The transfer gate 112 can be formed on a surface of a wafer (i.e., a semiconductor substrate 101) by a usual CMOS process. In FIG. 19B, the MOS transistor 112 includes source and drain diffusion regions 112a and 112b formed on a surface of the semiconductor substrate 101. A gate electrode 112c is provided above the substrate 101 between the diffusion regions 112a and 112b. The ferroelectric transistor 111 adjoins the MOS transistor 112 on the semiconductor substrate 101. The ferroelectric layer 111a and the semiconductor layer 111b are laminated on the conductive layer 111c, which functions as a lower electrode. Upper electrodes $111d_1$ and $111d_2$ are provided at opposing ends of the semiconductor layer 111b. The upper electrode $111d_1$ at one end of the semiconductor layer 111b is connected to the diffusion layer 112b of the MOS transistor 112 via a metal wire 113. The other diffusion layer 112a of the MOS transistor 112 is connected to a metal wire 114 functioning as the bit line BL. The other upper electrode $111d_2$ and the lower electrode (conductive layer) 111c are set at the ½ $V_{cc}$ level during writing. The method for producing the ferroelectric memory cell 100 of the present example is substantially disclosed in Japanese National Patent Publication No. 5-505699 (corresponding to U.S. Pat. No. 5,119,329), which is incorporated herein by reference.

Next, the operation of the ferroelectric memory cell 100 will be described.

Data can be written in the ferroelectric memory cell 100 of the present example without supplying a pulse voltage signal to the drive line DL. In a memory cell array configuration including a plurality of ferroelectric memory cells 100 in a matrix, data can be written in a target memory cell without destroying the data stored in non-target memory cells that are coupled to activated word lines (i.e., whose transfer gates 112 are turned on) because the potentials of the bit lines BL of the non-target memory cells are fixed at the same potential as that of the drive lines DL. Thus, according to the present invention, it is unnecessary to divide the memory cell array (consisting essentially of a plurality of ferroelectric memory cells 100) into sub-arrays.

Specifically, when writing data in the memory cell 100, the bit line BL is set at the $V_{cc}$ level or 0 V, and the transfer gate 112 is turned on by activating the word line WL, while setting the drive line DL at the ½ $V_{cc}$ level.

Figure 20A:
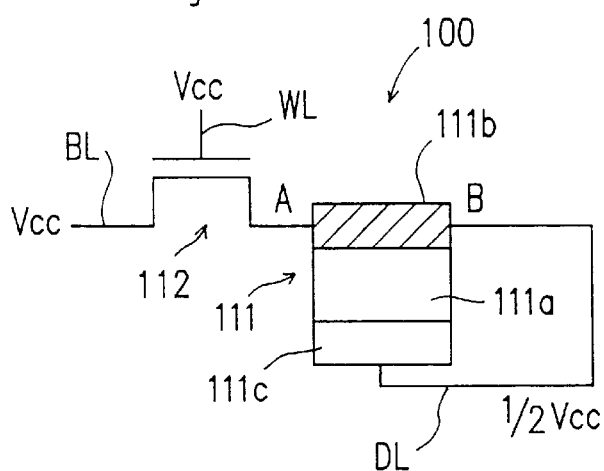
FIG. 20A is a diagram illustrating writing data "L" in the ferroelectric memory cell according to Example 1 of the present invention.
Figure 20B:
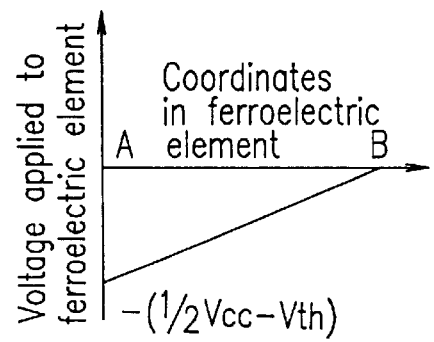
FIG. 20B is a graph illustrating writing data "L" in the ferroelectric memory cell according to Example 1 of the present invention.

More specifically, data "L" is written in the ferroelectric memory cell 100 as follows: As shown in FIG. 20A, after the bit line BL is set at the $V_{cc}$ level, the word line WL is activated so that a voltage equal to (the level of the bit line BL—the threshold voltage $V_{th}$ of the transfer gate 112) is applied at the end A of semiconductor layer 111b of the ferroelectric transistor 111. The voltage which is applied between the semiconductor layer 111b (on the ferroelectric layer 111a) and the lower electrode 111c in this state has a characteristic curve as shown in FIG. 20B. As seen from FIG. 20B, the above-mentioned voltage gradually increases from the $-(½ V_{cc}-V_{th})$ to the reference level at the other end B (equal to ½$V_{cc}$ as described later). Herein, the direction of an electric field from the conductive layer 111c (the drive line DL) to the semiconductor layer 111b is defined as the "positive direction" for conciseness, whereas the other direction is defined as the "negative direction".

Figure 21A:
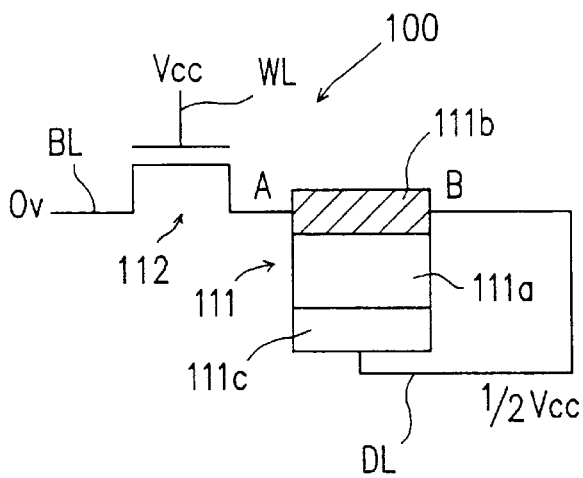
FIG. 21A is a diagram illustrating writing data "H" in the ferroelectric memory cell according to Example 1 of the present invention.

Data "H" is written in the ferroelectric memory cell 100 as follows: As shown in FIG. 21A, after the bit line BL is set at 0 V, the word line WL is activated so that a predetermined voltage is applied between the semiconductor layer 111b (on the ferroelectric layer 111a) and the lower electrode 111c.

Figure 21B:
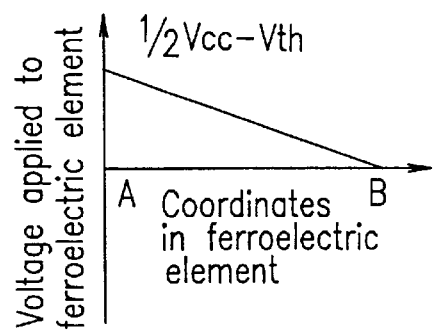
FIG. 21B is a graph illustrating writing data "H" in the ferroelectric memory cell according to Example 1 of the present invention.

The above-mentioned voltage has a characteristic curve as shown in FIG. 21B, where the voltage gradually decreases from (½ $V_{cc}-V_{th}$) to the reference level at the other end B.

The drive line DL is always maintained at the ½ $V_{cc}$ level whether the bit line BL is set at the $V_{cc}$ level or 0 V because of the resistance of the semiconductor layer 111b. (In view thereof, it is preferable to employ a regulator capable of supplying sufficient power.)

Figure 1:
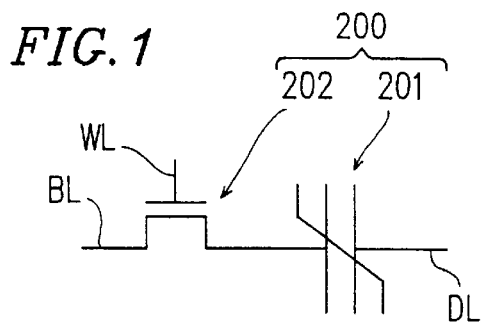
FIG. 1 is a diagram schematically showing the configuration of a conventional ferroelectric memory cell of a destructive-read type.
Figure 2A:
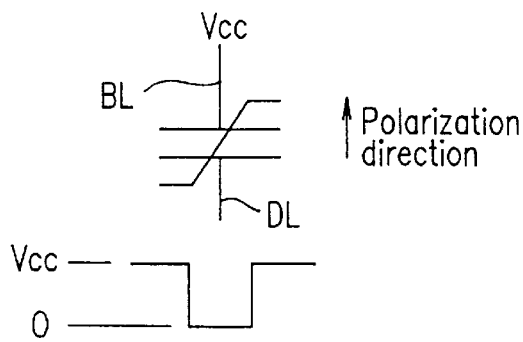
FIG. 2A is a diagram illustrating writing data "H" in a conventional ferroelectric memory cell of a destructive-read type.
Figure 2B:
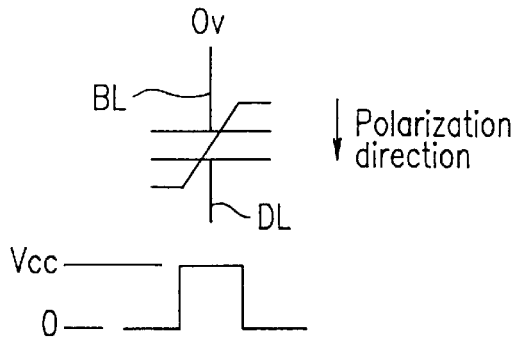
FIG. 2B is a diagram illustrating writing data "L" in a conventional ferroelectric memory cell of a destructive-read type.
Figure 3A:
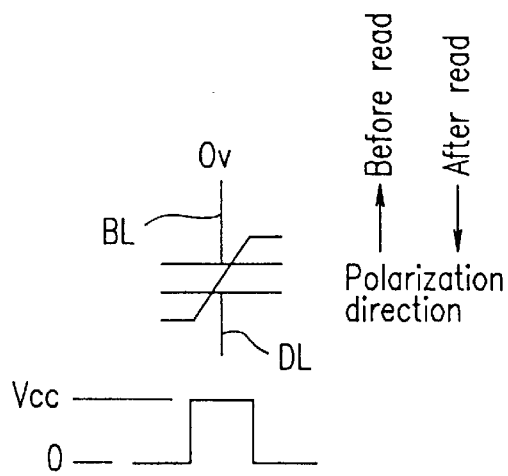
FIG. 3A is a diagram illustrating reading data "H" in a conventional ferroelectric memory cell of a destructive-read type.
Figure 3B:
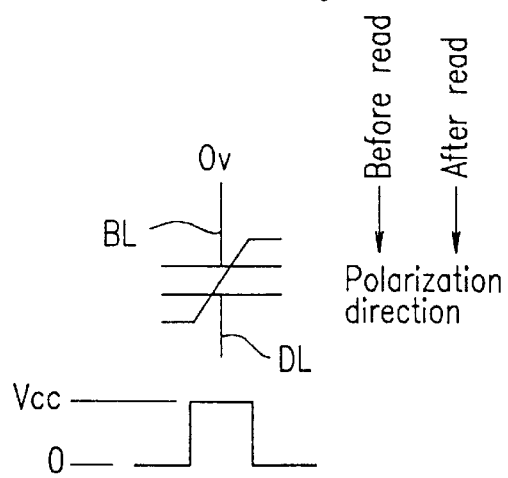
FIG. 3B is a diagram illustrating reading data "L" in a conventional ferroelectric memory cell of a destructive-read type.
Figure 4:
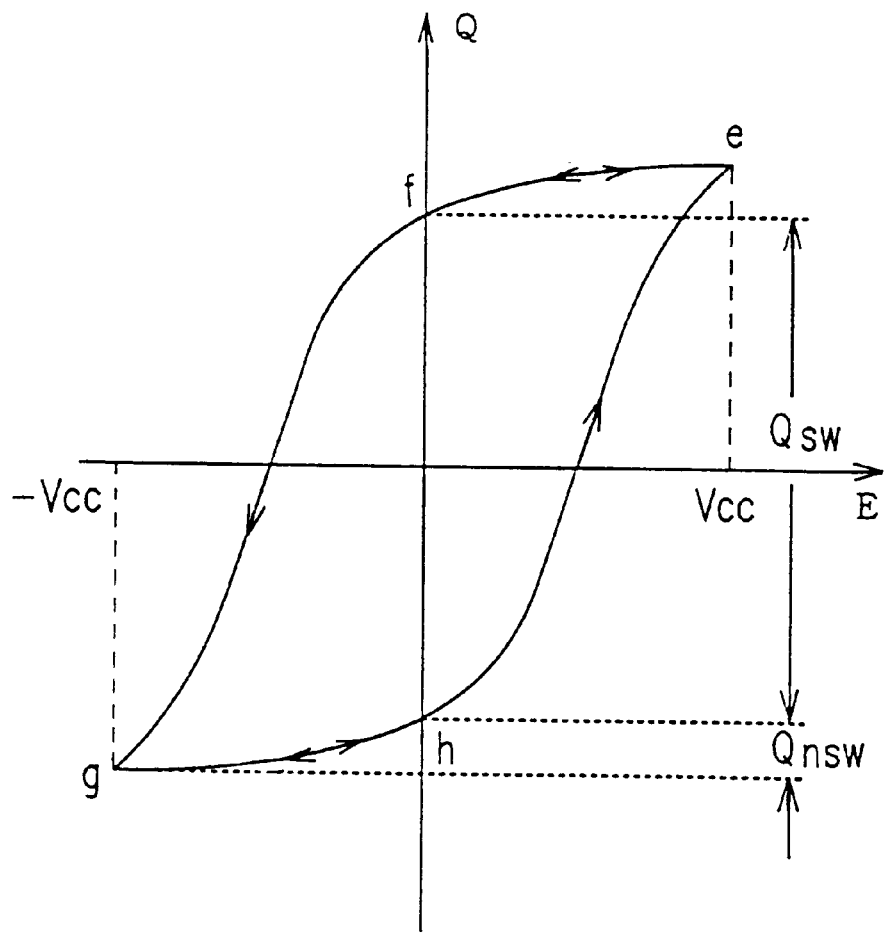
FIG. 4 is a graph showing a hysteresis curve of the polarization of a ferroelectric element of a conventional ferroelectric memory cell of a destructive-read type responsive to various voltage levels applied thereto.
Figure 5A:
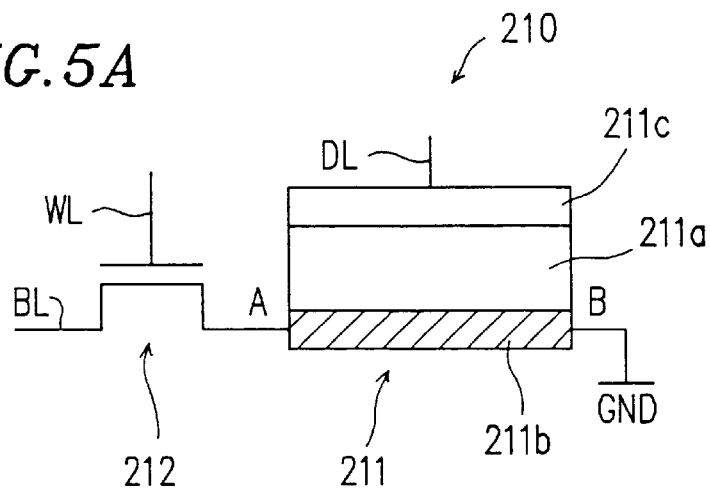
FIG. 5A is a diagram schematically showing the configuration of a conventional ferroelectric memory cell of a non-destructive read type.
Figure 5B:
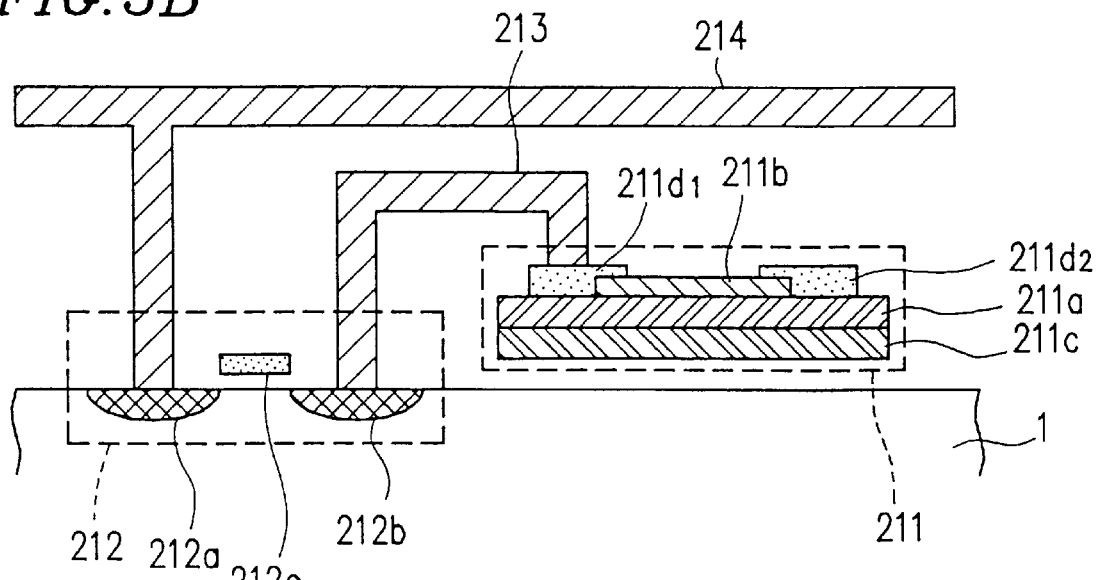
FIG. 5B is a cross-sectional showing the conventional ferroelectric memory cell shown in FIG. 5A.
Figure 6A:
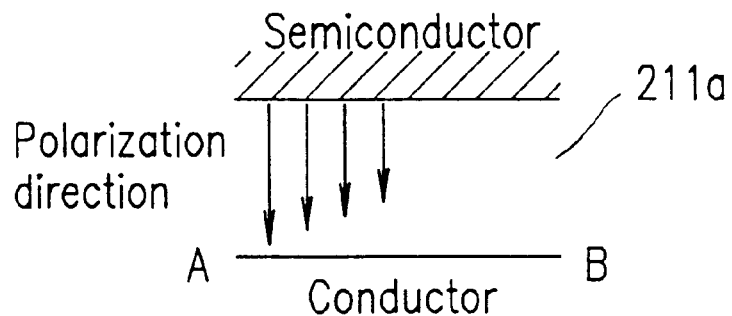
FIG. 6A is a diagram showing a polarization state of the ferroelectric element of the conventional ferroelectric memory cell of a non-destructive read type shown in FIGS. 5A and 5B when data "L" is written therein.
Figure 6B:
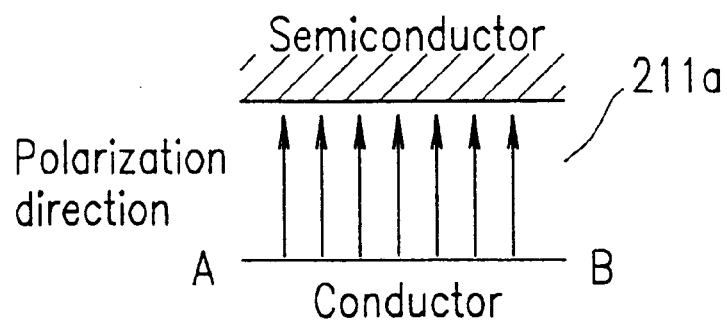
FIG. 6B is a diagram showing a polarization state of the ferroelectric element of the conventional ferroelectric memory cell of a non-destructive read type shown in FIGS. 5A and 5B when data "H" is written therein.
Figure 7:
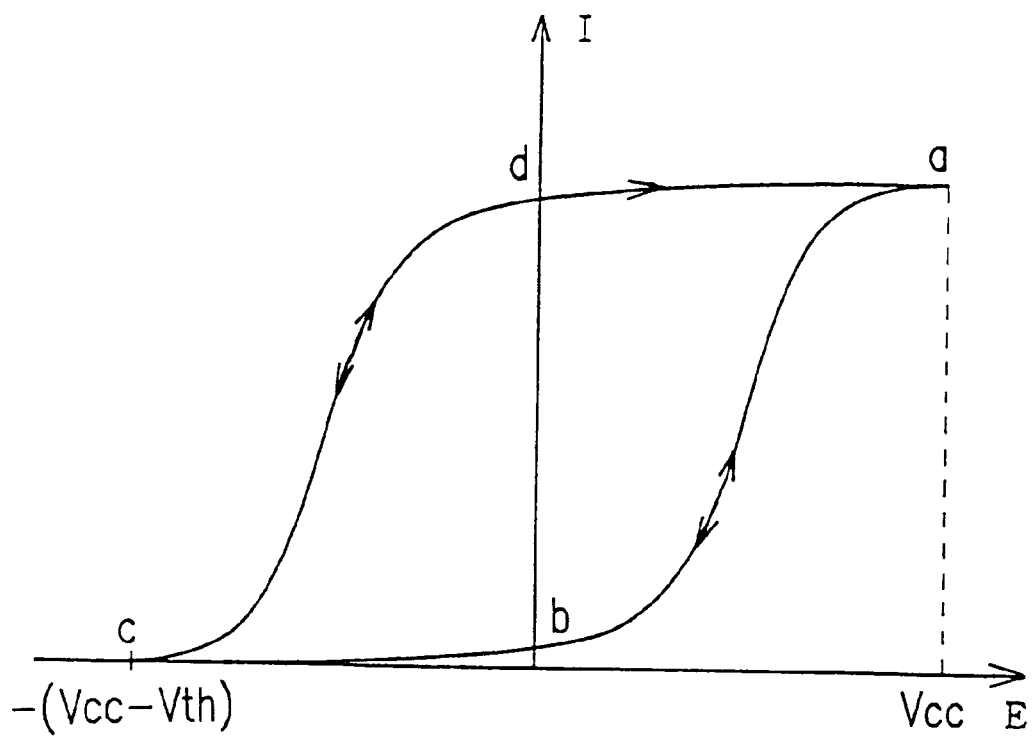
FIG. 7 is a graph showing a hysteresis curve of the conductivity of a semiconductor layer of a ferroelectric element of a conventional ferroelectric memory cell of a non-destructive read type responsive to various voltage levels applied to a ferroelectric layer thereof.
Figure 8A:
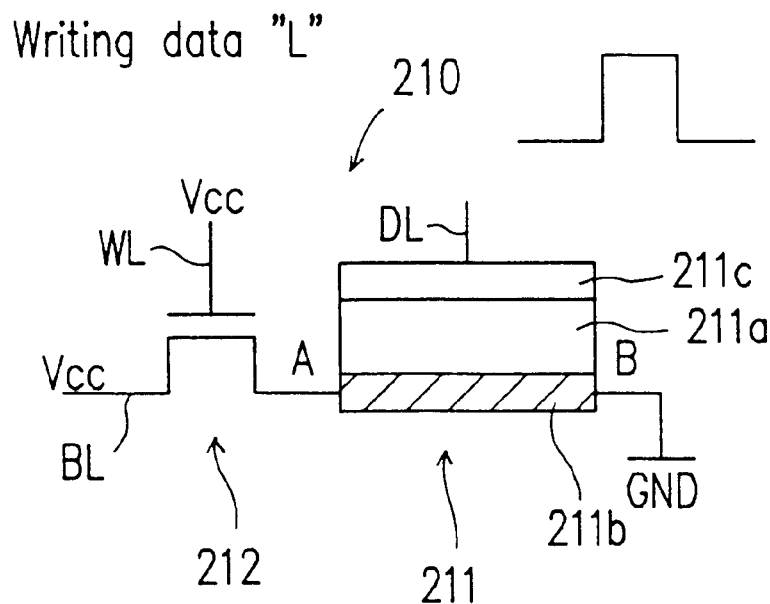
FIG. 8A is a diagram illustrating writing data "L" in a conventional ferroelectric memory cell of a nondestructive read type.
Figure 8B:
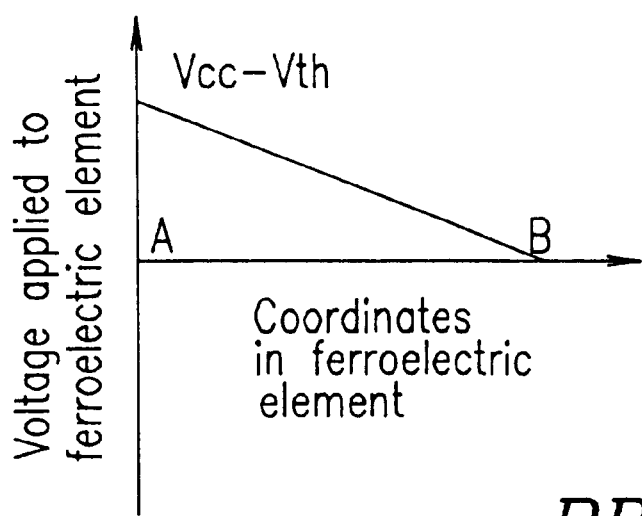
FIG. 8B is a graph illustrating writing data "L" in a conventional ferroelectric memory cell of a nondestructive read type.
Figure 9A:
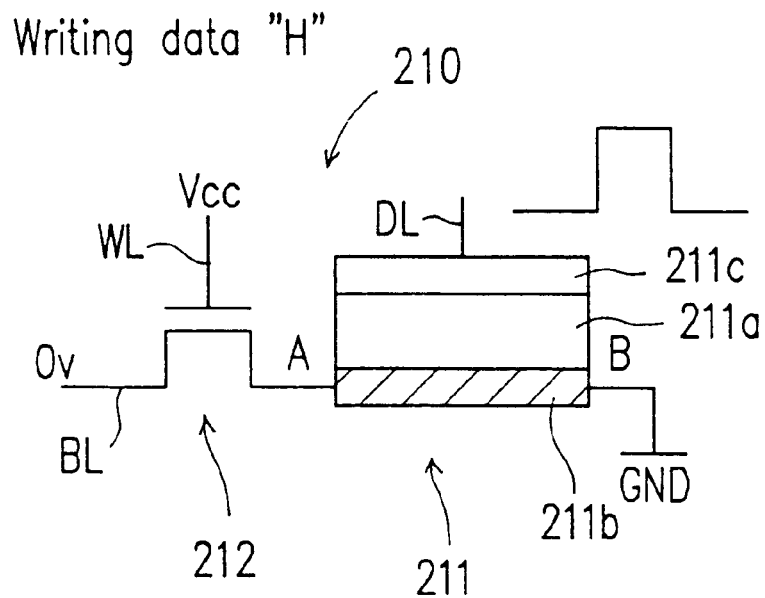
FIG. 9A is a diagram illustrating writing data "H" in a conventional ferroelectric memory cell of a nondestructive read type.
Figure 9B:
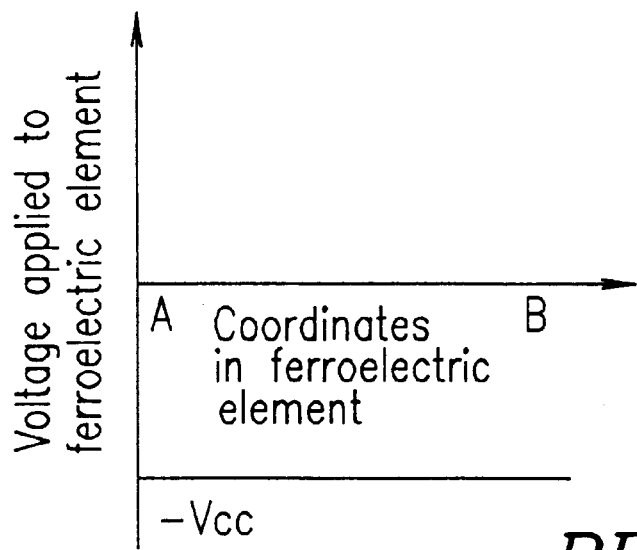
FIG. 9B is a graph illustrating writing data "H" in a conventional ferroelectric memory cell of a nondestructive read type.
Figure 10:
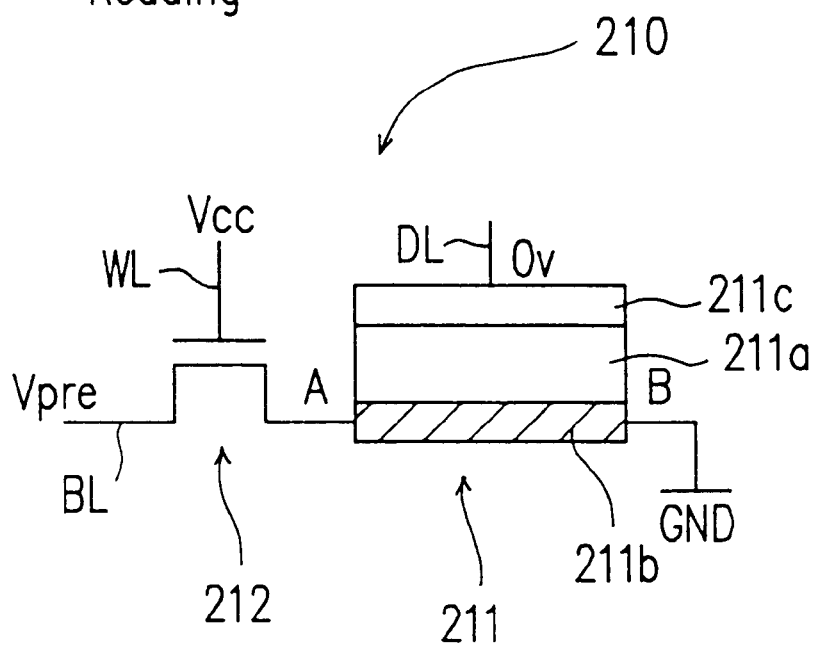
FIG. 10 is a diagram illustrating reading data in a conventional ferroelectric memory cell of a non-destructive read type.
Figure 11:
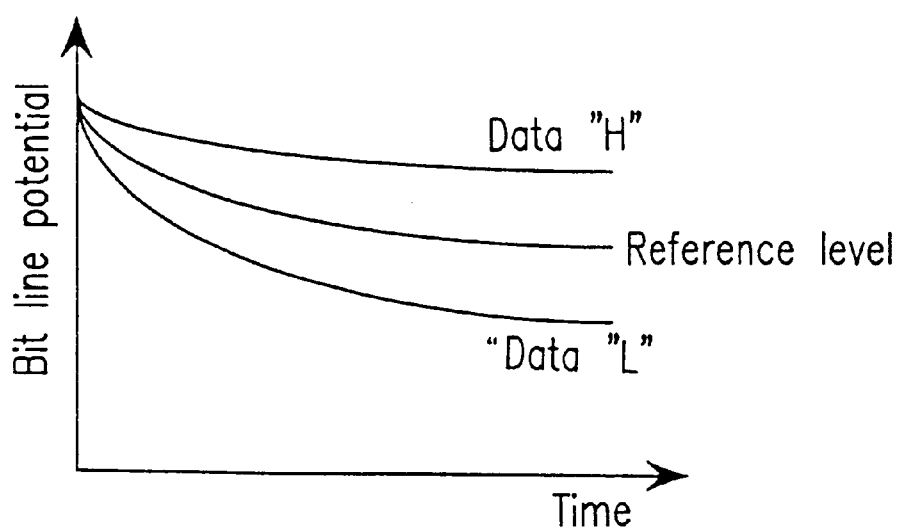
FIG. 11 is a graph showing the bit line potential when reading data in a non-destructive ferroelectric memory cell.
Figure 12:
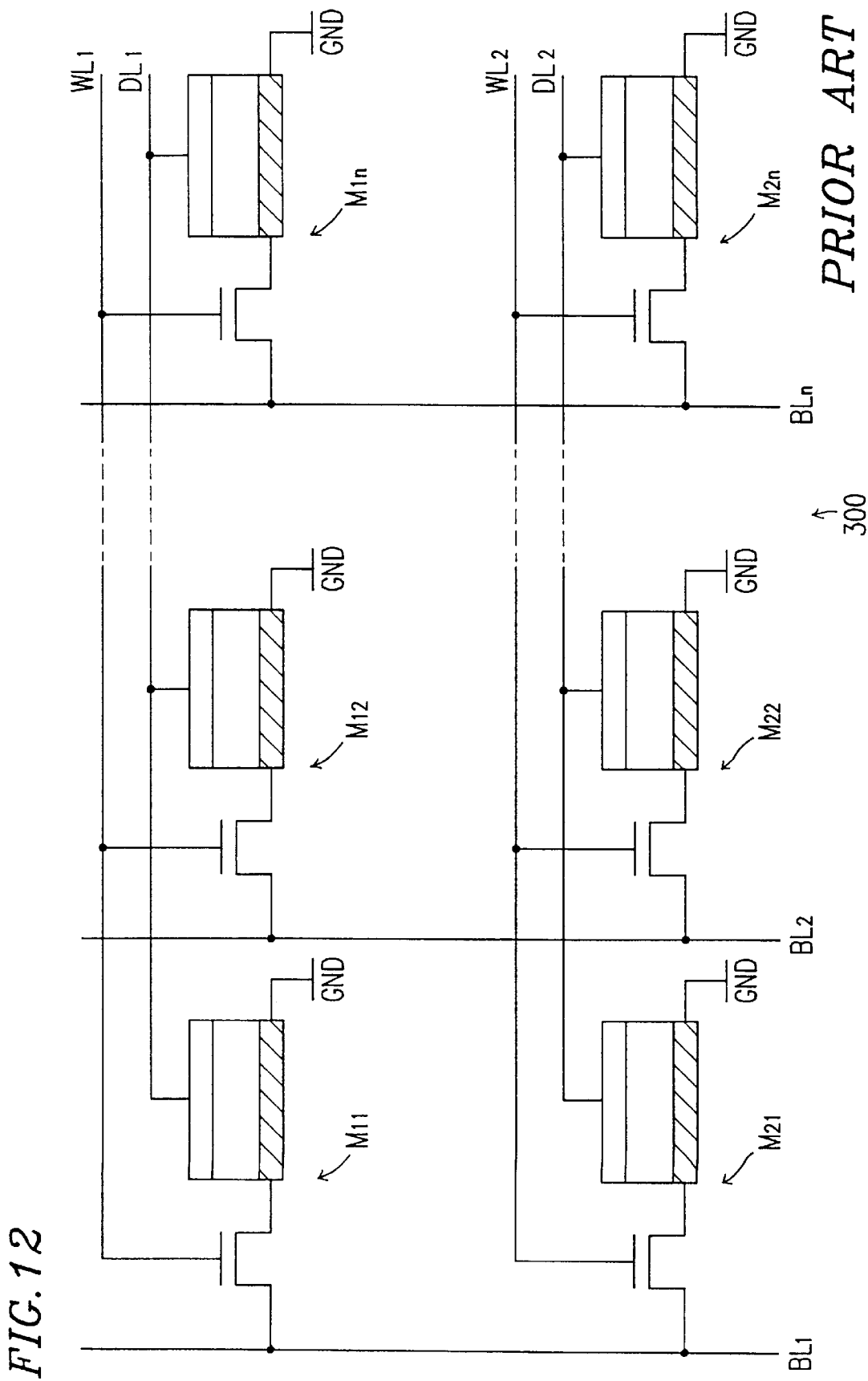
FIG. 12 is a diagram illustrating a memory cell array including the non-destructive type ferroelectric memory cells.
Figure 13:
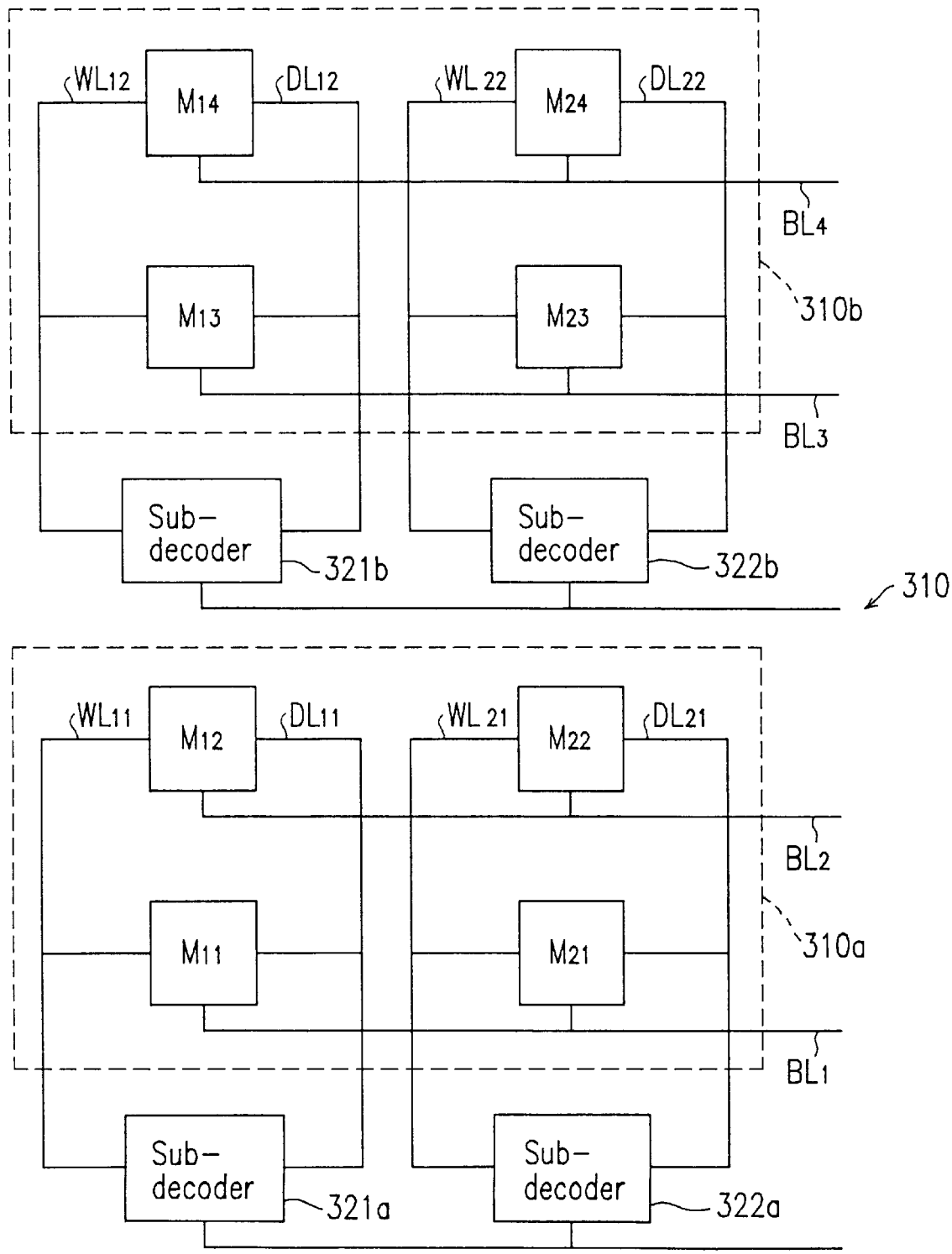
FIG. 13 is a diagram illustrating a memory cell array divided into sub-arrays.
Figure 14:
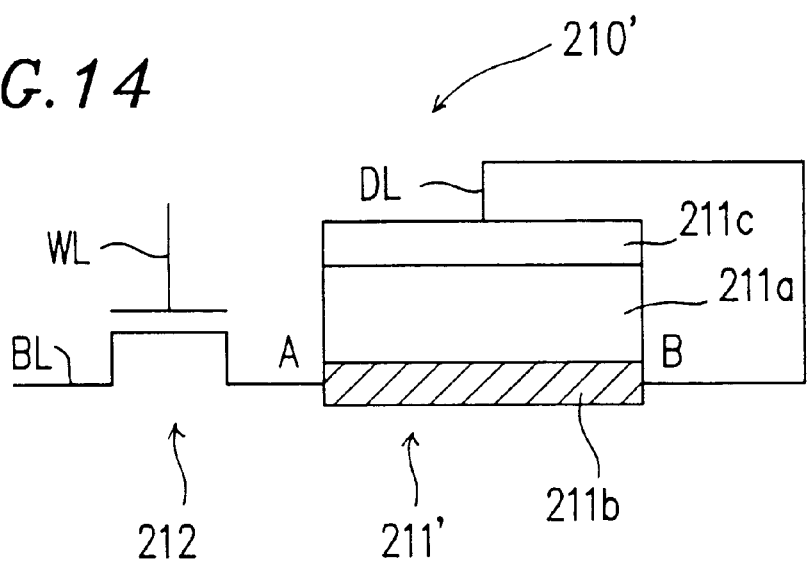
FIG. 14 is a schematic diagram showing a conventional non-destructive type ferroelectric memory cell of another configuration.
Figure 15A:
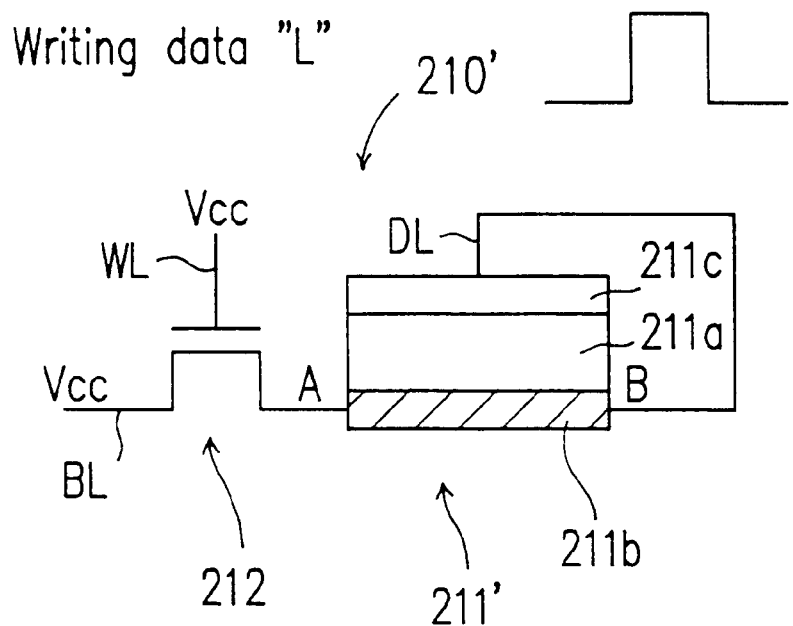
FIG. 15A is a diagram illustrating writing data "L" in a conventional ferroelectric memory cell of a non-destructive read type.
Figure 15B:
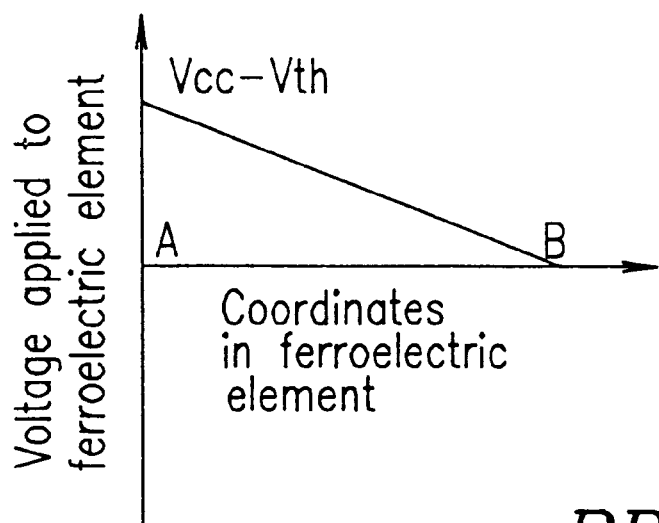
FIG. 15B is a graph illustrating writing data "L" in a conventional ferroelectric memory cell of a nondestructive read type.
Figure 16A:
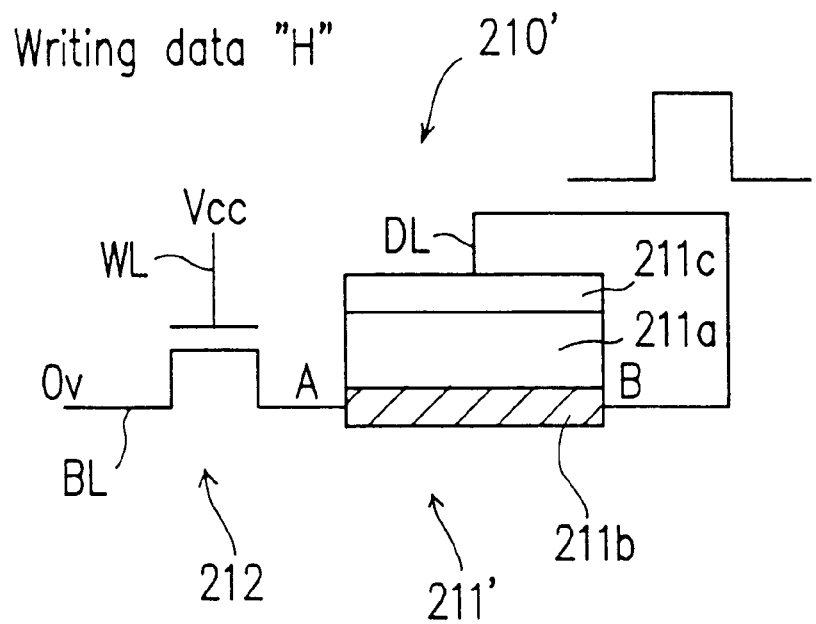
FIG. 16A is a diagram illustrating writing data "H" in a conventional ferroelectric memory cell of a non-destructive read type.
Figure 16B:
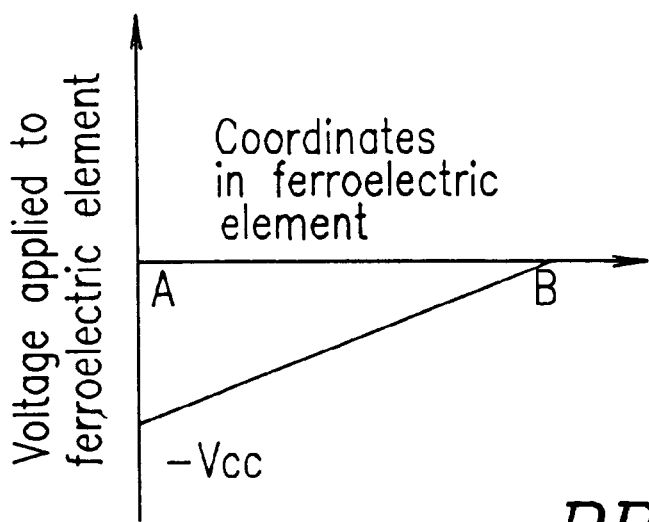
FIG. 16B is a graph illustrating writing data "H" in a conventional ferroelectric memory cell of a non-destructive read type.
Figure 17:
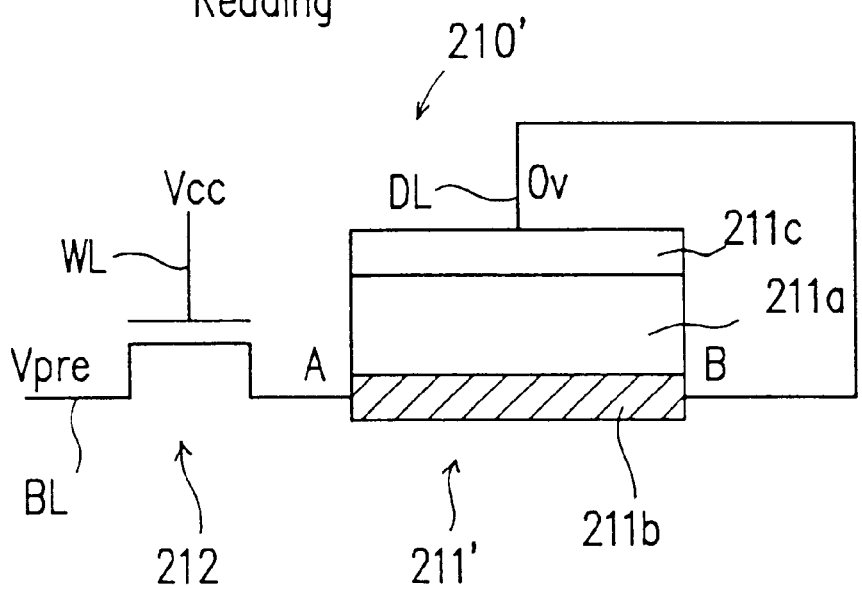
FIG. 17 is a diagram illustrating reading data in a conventional ferroelectric memory cell of a nondestructive read type.
Figure 18:
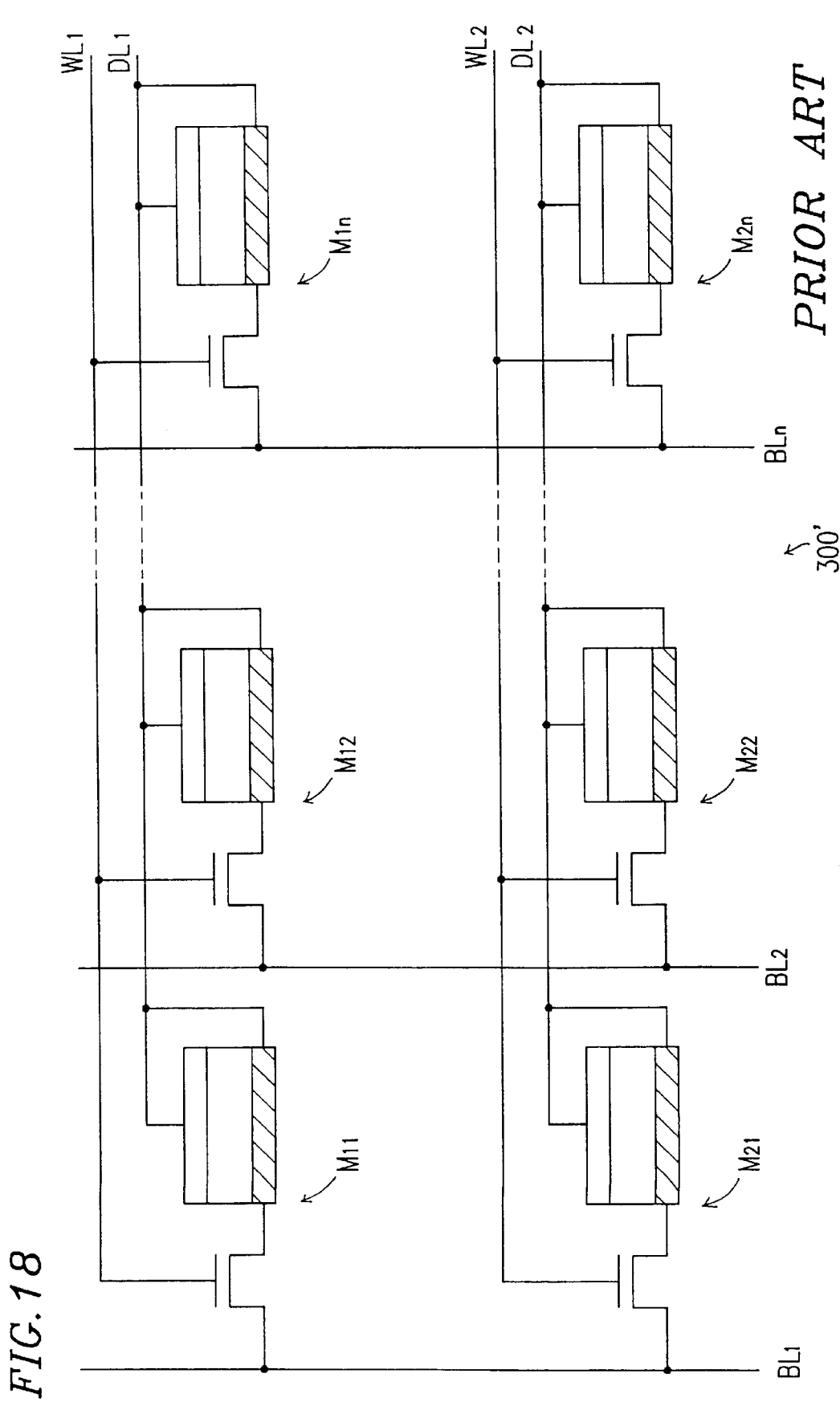
FIG. 18 is a diagram illustrating a memory cell array including the non-destructive read type ferroelectric memory cells shown in FIG. 14.
Figure 24A:
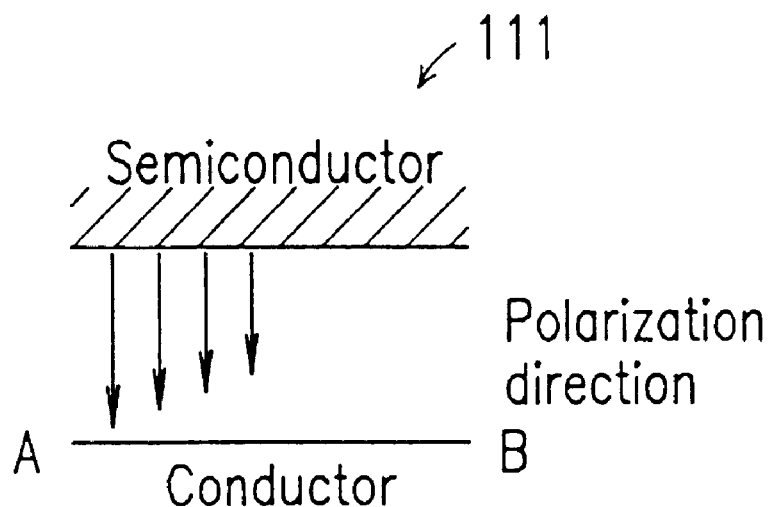
FIG. 24A is a diagram showing a polarization state of the ferroelectric element of the ferroelectric memory cell shown in FIGS. 19A and 19B when data "L" is written therein.
Figure 24B:
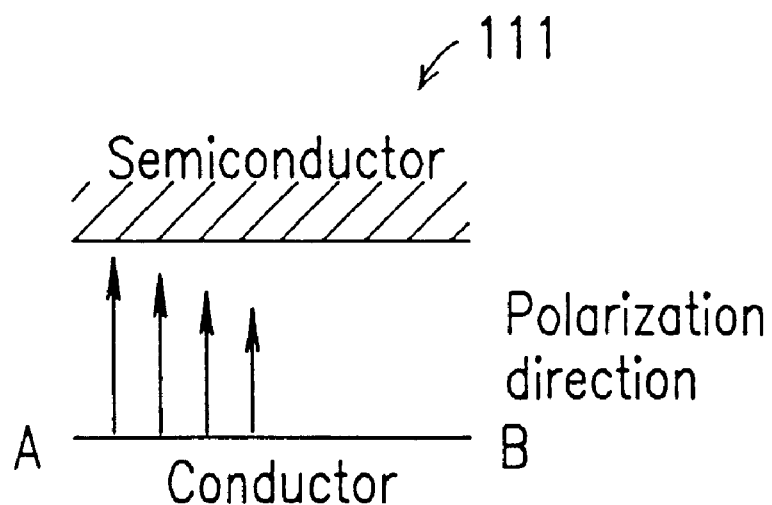
FIG. 24B is a diagram showing a polarization state of the ferroelectric element of the ferroelectric memory cell shown in FIGS. 19A and 19B when data "H" is written therein.

Due to the above-mentioned potential gradients during writing data "L" and writing data "H", the ferroelectric layer 111a is greatly polarized near the end A, but is substantially unpolarized near the end B, as shown in FIGS. 24A and 24B. The polarization states of the end A of the semiconductor layer 111b exhibit the same hysteresis curve as shown in FIG. 7 illustrating the polarization states of the semiconductor layer of a prior-art ferroelectric memory cell, and the description thereof is omitted.

Figure 22A:
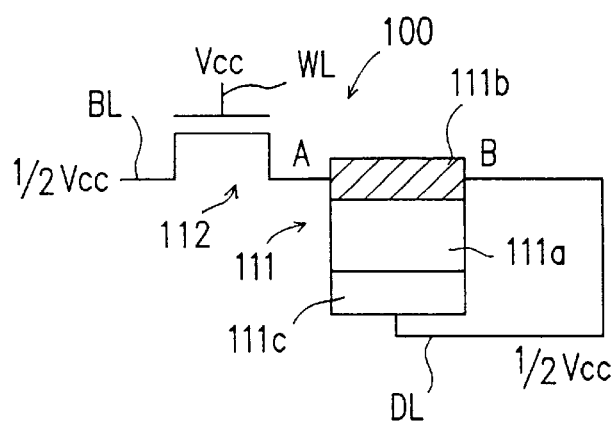
FIG. 22A is a diagram illustrating the non-accessed state of the ferroelectric memory cell according to Example 1 of the present invention during writing.
Figure 22B:
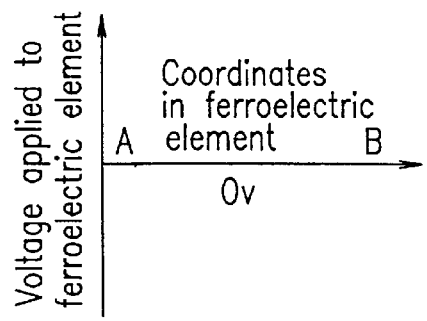
FIG. 22B is a graph illustrating the non-accessed state of the ferroelectric memory cell according to Example 1 of the present invention during writing.

During writing, the bit lines BL coupled to the non-target memory cells are set at the ½ $V_{cc}$ level as shown in FIG. 22A. As a result, even if the word line WL is activated so as to turn on the transfer gate 112 of any non-target memory cell, both ends of the ferroelectric layer 111a of the ferroelectric transistor 111 are at the same potential. Therefore, as shown in FIG. 22B, no voltage is applied to the ferroelectric layers 111a of the non-target memory cells, thereby preventing the polarization states of the ferroelectric layers 111a from being destroyed.

Herein, the reference level is the ½ $V_{cc}$ level, at which the drive line DL is fixed during writing. However, the voltage applied to the drive line DL and the bit line BL of the non-target memory cell during writing is not limited to ½$V_{cc}$; it can be any value between the $V_{cc}$ level and 0 V (excluding both the $V_{cc}$ level and 0 V).

Figure 23:
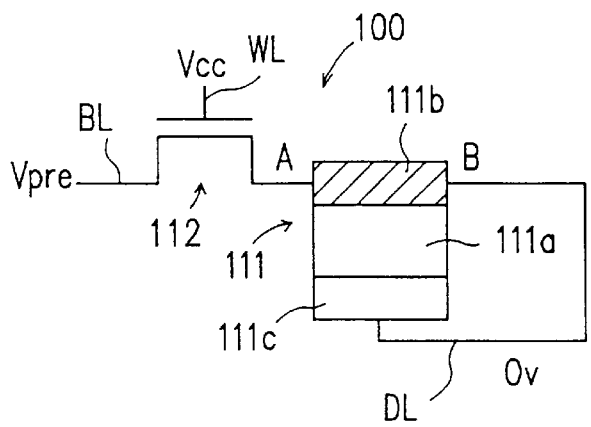
FIG. 23 is a diagram illustrating reading data in the ferroelectric memory cell according to Example 1 of the present invention.

Data stored in the ferroelectric memory cell 100 can be read by precharging the drive line DL at 0 V and precharging the bit line BL at a predetermined voltage which does not substantially affect the polarization of the ferroelectric layer 111a (e.g., 0.4 V) and activating the word line WL to turn on the transfer gate 112, thereby extracting the charge on the bit line BL to the ground level (as shown in FIG. 23).

As described above, the ferroelectric memory cell 100 of the present example includes the transfer gate 112 and the ferroelectric transistor 111 such that one end A of the semiconductor layer 111b (which stores information) is short-circuited to the conductive layer 111c, and the other end B of the semiconductor layer 111b is coupled to the transfer gate 112. When reading data stored in the ferroelectric memory cell 100, the drive line DL is precharged at 0 V and the bit line BL is precharged at a predetermined voltage which does not substantially affect the polarization of the ferroelectric layer 111a (e.g., 0.4 V). As a result, the charge on the bit line BL is extracted to the ground level (as shown in FIG. 23) via the semiconductor layer 111b at the other end B. Since the ferroelectric transistor 111 has different resistivities depending on the data (i.e., "H" or "L") stored in the ferroelectric memory cell 100, the potential of the bit line BL also differs depending on whether data "H" or data "L" is stored in the ferroelectric memory cell 100. By detecting the different potentials appearing at the bit line BL, the data stored in the memory cell 100 can be read without being destroyed.

During writing, a first voltage and a second voltage (i.e., $V_{cc}$ and 0 V, respectively) are applied to the end A of the semiconductor layer 111b from the bit line BL via the transfer gate 112, and a third voltage (e.g., ½$V_{cc}$) whose potential level is between the first and second voltages is applied to the end B of the semiconductor layer 111b (which is short-circuited to the conductive layer 111c). As a result, data corresponding to the first or the second potential (voltage) can be written in the ferroelectric memory cell 100. Because of the third voltage (e.g., ½$V_{cc}$) applied to the ends B of the semiconductor layers 111b of the non-target memory cells from the bit lines BL via the transfer gates 112, the data stored in the non-target memory cells is prevented from being destroyed.

Thus, in accordance with the memory cell array incorporating the ferroelectric memory cell 100 of the present example, the destruction of data during writing is prevented without dividing the memory cell array into a plurality of sub-arrays. Thus, the present example realizes a non-destructive ferroelectric memory cell with a simple configuration, a small memory cell array size, and a simplified control circuit for controlling data access.

EXAMPLE 2

Hereinafter, a memory composed essentially of a memory cell array 110 including a plurality of the above-described ferroelectric memory cells 100 will be described as Example 2 of the present invention.

Figure 25:
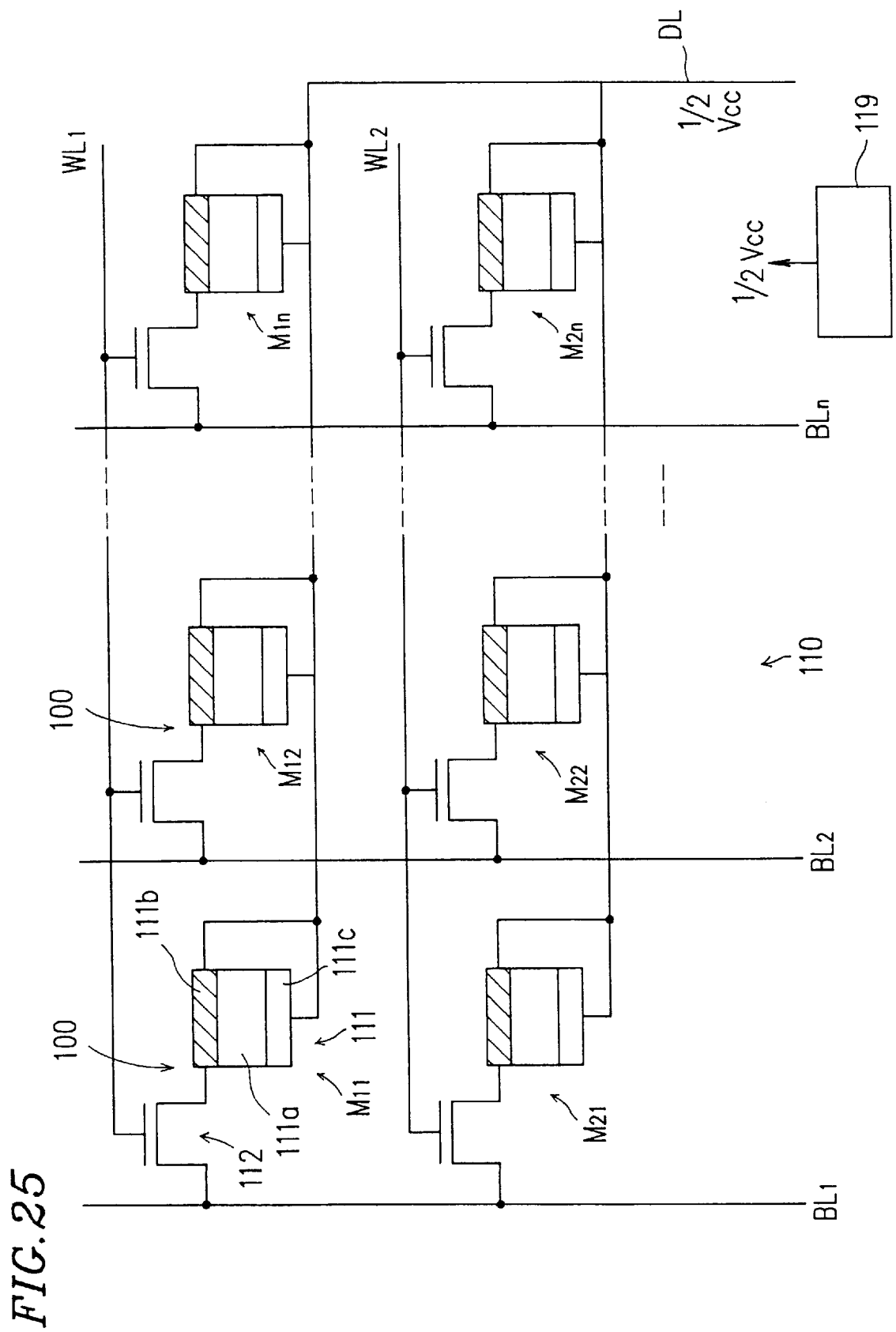
FIG. 25 is a diagram illustrating a memory device according to Example 2 of the present invention consisting essentially of a memory cell array of ferroelectric memory cells shown in FIGS. 19A and 19B.

FIG. 25 shows the memory cell array 110. The memory cell array 110 consists essentially of the above-described memory cells 100 arranged in a matrix shape. In the memory cell array 110, bit lines $BL_1$ to $BL_n$ are provided for the respective columns of memory cells 100, each bit line applying a predetermined potential to the ends A of the semiconductor layer 111b of the memory cells 100 in the corresponding column. Moreover, word lines $WL_1$ to $WL_n$ are provided for the respective rows of memory cells 100, each word line controlling the transfer gates 112 of the memory cells 100 in the corresponding row. Furthermore, the memory cell array 110 includes a drive line DL commonly connected to the conductive layers 111c of the memory cells 100.

The above memory device also includes a power supply 119 for generating a potential of the $\frac{1}{2}V_{cc}$ level to be supplied to the bit lines BL and the drive line DL.

When data "H" is to be written in a memory cell $M_{11}$ (target memory cell) shown in FIG. 25, for example, the bit line $BL_1$ is set at the $V_{cc}$ level; the drive line DL and the bit lines $BL_2$ to $BL_n$ are set at the $\frac{1}{2}V_{cc}$ level; and the transfer gate 112 of the memory cell $M_{11}$ is turned on by activating the word line $WL_1$. Although the memory cells $M_{12}$ to $M_{1n}$ are electrically connected to the respective bit lines $BL_2$ to $BL_n$ because of the activated word line $WL_1$, no voltage is applied to the ferroelectric layers of the memory cells $M_{12}$ to $M_{1n}$ because the bit lines $BL_2$ to $BL_n$ are set at the $\frac{1}{2}V_{cc}$ level. As a result, the polarization states of the non-target memory cells $M_{12}$ to $M_{1n}$ do not reverse.

As for the non-target memory cells $M_{22}$ to $M_{2n}$, the transfer gates 112 thereof are turned off so that the semiconductor layer 111b and the conductive layer 111c interposing the ferroelectric layer 111a are both at the $\frac{1}{2}V_{cc}$ level. As a result, the polarization states of the non-target memory cells $M_{22}$ to $M_{2n}$ do not reverse.

Data stored in any ferroelectric memory cell 100 in the memory cell array 110 can be read in a manner similar to the prior art technique, that is, by precharging the drive line DL at 0 V and precharging the corresponding bit line BL at a predetermined voltage which does not substantially affect the polarization of the ferroelectric layer 111a (e.g., 0.4 V) and activating the corresponding word line WL to turn on the transfer gate 112, thereby extracting the charge on the bit line BL to the ground level (as shown in FIG. 23).

For example, data stored in the memory cell $M_{11}$ can be read as follows: The drive line DL is set at 0 V; the bit line $BL_1$ is precharged at t he above-mentioned predetermined voltage (e.g., 0.4 V); the word line $WL_1$ is activated to turn on the transfer gate 112, thereby extracting the charge on the bit line $BL_1$ to the ground level.

The data stored in a given memory cell is determined by comparing the potential read out from the memory cell against a reference level which is an intermediate potential between the respective read-out potentials corresponding to data "H" and data "L".

As the reference level (intermediate potential), a potential read out from a reference cell in which the ferroelectric layer 111a of the ferroelectric memory cell 111 has a polarization state between the polarization state of the ferroelectric layer of the ferroelectric memory cells storing data "H" and the polarization state of the ferroelectric layer of the ferroelectric memory cells storing data "L" can be used.

Alternatively, it is also possible to generate an intermediate potential by short-circuiting two reference bit lines (i.e., a bit line from which "H" data is being read out and another bit line from which "L" data is being read out) and employ the intermediate potential as a reference level.

Furthermore, the method for generating the reference level is not limited to the above-described method. For example, it is also applicable to provide a circuit for generating a level which is somewhat higher than the "L" level and somewhat lower than the "H" level and employ the output voltage thereof as a reference level.

Thus, in accordance with the memory device of the present example, data can be written in a target memory cell while preventing the destruction of data (i.e., change in the polarization state of the ferroelectric layer) in the non-target memory cells, without dividing the memory cell array into a plurality of sub-arrays. Thus, the present example realizes a non-destructive ferroelectric memory cell with a simple configuration, a small memory cell array size, and a simplified control circuit for controlling data access.

As a result, both the memory cell array and the peripheral circuitry thereof can be simplified, thereby reducing the chip size and hence the production cost of the device.

Moreover, the information from the memory cell can be accurately read by determining the data stored in the memory cell by comparing the potential read out from the memory cell against a reference level which is an intermediate potential between the respective read-out potentials corresponding to data "H" and data "L".

Moreover, it is also possible to employ as the reference level a potential read out from a reference cell in which the ferroelectric layer 111a of the ferroelectric memory cell 111 has a polarization state between the polarization state of the ferroelectric layer of the ferroelectric memory cells storing data "H" and the polarization state of the ferroelectric layer of the ferroelectric memory cells storing data "L". Thus, the reference level (intermediate potential) can be generated within the memory cell array 110, thereby eliminating the need for a power supply section dedicated to the generation of the intermediate potential. As a result, the device can be further simplified.

Alternatively, it is also possible to generate an intermediate potential by short-circuiting two reference bit lines (i.e., a bit line from which "H" data is being read out and another bit line from which "L" data is being read out) and employ the intermediate potential as a reference level. Thus, the reference level (intermediate potential) can be generated within the memory cell array 110, whereby the device can be further simplified.

As described above, the memory cell according to the present invention includes: a ferroelectric transistor including a semiconductor layer (for storing information therein) having a first end short-circuited with a conductive layer; and a transfer gate connected to a second end of the semiconductor layer. By precharging a bit line at a predetermined voltage which does not substantially affect the polarization of the ferroelectric layer of the ferroelectric transistor and turning on the transfer gate to extract the charge on the bit line to the ground level via the first end, a potential corresponding to the resistivity of the semiconductor layer appears on the bit line. Thus, data stored in any ferroelectric memory cell can be read without being destroyed.

Information can be written in the ferroelectric memory cell of the present invention by applying a first voltage or a second voltage (having different potential levels) corresponding to either one of the two values of binary information at the second end of the semiconductor layer while applying a third voltage having a potential level between the first and second voltages. In a memory cell array configuration, the third potential applied at the second end of the semiconductor layer of the ferroelectric transistor allows data to be written in a target memory cell without destroying the data stored in non-target memory cells. Therefore, according to the present invention, it is unnecessary to divide the memory cell array into a plurality of sub-arrays. Thus, the present invention realizes a non-destructive ferroelectric memory cell with a simple configuration, a small memory cell array size, and a simplified control circuit for controlling data access.

As a result, both the memory cell array and the peripheral circuitry thereof can be simplified, thereby reducing the chip size and hence the production cost of the device.

Moreover, the information from the memory cell can be accurately read by determining the data stored in the memory cell by comparing the potential read out from the memory cell against a reference level which is an intermediate potential between the respective read-out potentials corresponding to data "H" and data "L".

Moreover, it is also possible to employ as the reference level a potential read out from a reference cell in which the ferroelectric layer 111a of the ferroelectric memory cell 111 has a polarization state between the polarization state of the ferroelectric layer of the ferroelectric memory cells storing data "H" and the polarization state of the ferroelectric layer of the ferroelectric memory cells storing data "L". Thus, the reference level (intermediate potential) can be generated within the memory cell array 110, thereby eliminating the need for a power supply section dedicated to the generation of the intermediate potential. As a result, the device can be further simplified.

Alternatively, it is also possible to generate an intermediate potential by short-circuiting two reference bit lines (i.e., a bit line from which "H" data is being read out and another bit line from which "L" data is being read out) and employ the intermediate potential as a reference level. Thus, the reference level (intermediate potential) can be generated within the memory cell array 110, whereby the device can be further simplified.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for accessing a memory cell array including: a plurality of ferroelectric semiconductor memory cells formed in a matrix having rows and columns; and a plurality of bit lines provided for each column of the plurality of the ferroelectric semiconductor memory cells, each ferroelectric semiconductor memory cell including:

a ferroelectric layer having a first face and a second face;
a semiconductor layer disposed on the first face of the ferroelectric layer so as to have different conductivity values depending on a polarization state of the ferroelectric layer, the semiconductor layer having a first end and a second end; and
a conductive layer disposed on the second face of the ferroelectric layer, the conductive layer being electrically connected to the first end of the semiconductor layer, the plurality of bit lines are electrically connected to the second end of the semiconductor layer of respective one of the columns of the plurality of ferroelectric semiconductor memory cells,
in write operations in which binary information having a first value and a second value is written to at least one of the plurality of ferroelectric semiconductor memory cells by applying one of a first voltage and a second voltage respectively corresponding to the first value and the second value, the method comprising the steps of:
applying either one of the first voltage or the second voltage to the second end of the semiconductor layer of the at least one of the plurality of the ferroelectric semiconductor memory cells, and
applying a third voltage, having a potential between the first voltage and the second voltage, to the first end of the semiconductor layer and the conductive layer of each of the plurality of the ferroelectric semiconductor memory cells, while applying the third voltage to the bit lines not electrically connected to the at least one of the plurality of the ferroelectric semiconductor memory cells.

2. A method for accessing a memory cell array according to claim 1,
in read operations in which binary information having the first value and the second value is read from the ferroelectric semiconductor memory cells, the method comprising the steps of:
applying a predetermined voltage at the first end of the semiconductor layer of the at least one of the plurality of the ferroelectric semiconductor memory cell while applying a fourth voltage at the second end of the semiconductor layer of the at least one of the plurality of the ferroelectric semiconductor memory cell, the fourth voltage having a potential level which does not affect the polarization state of the ferroelectric layer of the selected ferroelectric semiconductor memory cell due to a difference in level between the fourth voltage and said predetermined voltage.

3. A method for accessing the memory cell array according to claim 2, wherein
the binary information stored in the ferroelectric semiconductor memory cell is read out by comparing a potential level of a voltage signal which is read out from the selected ferroelectric semiconductor memory cell against a predetermined reference potential having a level between predetermined read-out potentials corresponding to the first and second values of the binary information.

4. A method for accessing the memory cell array according to claim 3, wherein the predetermined reference potential is a potential level of a voltage signal which is read out from a reference ferroelectric semiconductor memory cell including a ferroelectric layer having a polarization state between a polarization state of a ferroelectric semiconductor memory cell storing the first value of the binary information and a polarization state of a ferroelectric semiconductor memory cell storing the second value of the information.

5. A method for accessing the memory cell array according to claim 3, wherein the predetermined reference potential is generated by short-circuiting a first reference bit line having a read-out potential corresponding to the first value of the binary information and a second reference bit line having a read-out potential corresponding to the second value of the binary information.

6. A method for accessing a memory cell array according to claim 2, wherein the predetermined voltage is either one of the first voltage or the second voltage.

* * * * *